(12) United States Patent
    Elce et al.

(10) Patent No.: US 8,114,948 B2
(45) Date of Patent: Feb. 14, 2012

(54) PHOTOSENSITIVE COMPOSITIONS BASED ON POLYCYCLIC POLYMERS

(75) Inventors: Edmund Elce, Strongsville, OH (US); Takashi Hirano, Tokyo (JP); Jeffrey C. Krotine, Jr., Strongsville, OH (US); Larry F. Rhodes, Silver Lake, OH (US); Brian L. Goodall, Ambler, PA (US); SaiKumar Jayaraman, Chandler, AZ (US); W. Chris McDougall, Midland, MI (US); Shenliang Sun, Bethany, CT (US)

(73) Assignee: Sumitomo Bakelite Company, Ltd., Tokyo (JP)

( * ) Notice: Subject to any disclaimer, the term of this patent is extended or adjusted under 35 U.S.C. 154(b) by 586 days.

(21) Appl. No.: 11/324,738

(22) Filed: Jan. 3, 2006

(65) Prior Publication Data
US 2006/0167197 A1      Jul. 27, 2006

Related U.S. Application Data

(62) Division of application No. 10/465,511, filed on Jun. 19, 2003, now Pat. No. 7,022,790.

(60) Provisional application No. 60/393,726, filed on Jul. 3, 2002.

(51) Int. Cl.
    C08F 10/00      (2006.01)
    C08F 36/00      (2006.01)
    C08G 59/00      (2006.01)

(52) U.S. Cl. .................... 526/281; 526/283; 528/403

(58) Field of Classification Search .............. 526/281, 526/283; 528/403
    See application file for complete search history.

(56) References Cited

U.S. PATENT DOCUMENTS

| | | | |
|---|---|---|---|
| 5,468,819 | A | 11/1995 | Goodall et al. |
| 5,712,407 | A | 1/1998 | Kreutzberger et al. |
| 5,783,639 | A | 7/1998 | Kataoka et al. |
| 5,879,592 | A | 3/1999 | Kumar |
| 5,895,800 | A | 4/1999 | Kataoka et al. |
| 6,001,488 | A | 12/1999 | Kataoka et al. |
| 6,121,340 | A | 9/2000 | Shick et al. |
| 6,136,499 | A | 10/2000 | Goodall et al. |
| 6,232,417 | B1 | 5/2001 | Rhodes et al. |
| 6,294,616 | B1 | 9/2001 | Rhodes et al. |
| 6,346,581 | B1 * | 2/2002 | Tsunogae et al. ......... 525/332.1 |
| 6,455,650 | B1 | 9/2002 | Lipian et al. |
| 7,022,790 | B2 | 4/2006 | Elce et al. |
| 2002/0052454 | A1 | 5/2002 | Lipian et al. |

FOREIGN PATENT DOCUMENTS

| | | |
|---|---|---|
| JP | 8259784 | 10/1996 |
| JP | 10158337 | 6/1998 |
| WO | WO 97/33198 | 9/1997 |
| WO | WO0020472 | 4/2000 |

OTHER PUBLICATIONS

Wilks, E.S. "Polymer nomenclature: the controversy between source-based and structure-based representations (a personal perspective)," 25 Prog. Polym. Sci. 9, 85 (2000).
Nicole R. Grove et al., *Functionalized Polynorbornene Dielectric Polymers: Adhesion and Mechanical Properties*, Journal of Polymer Science: Part B, 1999, pp. 3003-3010, vol. 37.
Kathleen Nargi-Toth et al., *Manufacturing High-Density Interconnect Structures*, Circuits Assembly, Feb. 1999, pp. 4047.
Juan Segurola et al., *Photocuring Activity of Several Commercial, Near UV Activated Photoinitiators in Clear and Pigmented Systems*, Journal of Coatings Technology, Jul. 1999, pp. 61-67, vol. 71, No. 894.
Ralf Ruhmann et al., *Reduction of Internal Stress in a SU-8-Like Negative Tone Photoresist for MEMS Applications by Chemical Modification*, Proceedings of SPIE, Advances in Resist Technology and Processing XVIII, 2001, pp. 502-510, vol. 4245.
N. Labianca et al., *High Aspect Ratio Resist for Thick Film Applications*, Proceedings of SPIE, Advances in Resist Technology and Processing, XII, 1995, pp. 846-852, vol. 2438.
K. Lee et al., *Micromachining Applications of a High Resolution Ultrathick Photoresist*, Journal of Vacuum Science & Technology B, Nov./Dec. 1995, pp. 3012-3016, vol. 13, No. 6.
A. Schneider et al., *Comparison of PMMA and SU-8 Resist Moulds for Embossing of PZT to Produce High-Aspect-Ration Microstructures Using LIGA Process*, Microsystem Technologies, 2002, pp. 88-92, vol. 8, Springer-Verlag.

(Continued)

*Primary Examiner* — William Cheung
(74) *Attorney, Agent, or Firm* — The Webb Law Firm

(57) ABSTRACT

A copolymer composition including a copolymer having repeat units of structural formula I:

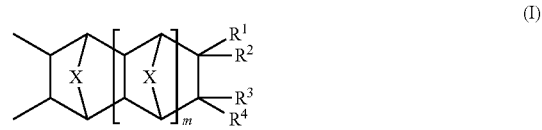

(I)

where X is selected from $-CH_2-$, $-CH_2-CH_2-$ and O; m is an integer from 0 to 5; and each occurrence of $R^1$-$R^4$ are independently selected from H; $C_1$ to $C_{25}$ linear, branched, and cyclic alkyl, aryl, aralkyl, alkaryl, alkenyl and alkynyl that can include one or more hetero atoms selected from O, N, and Si; a group that contains an epoxy functionality; $-(CH_2)_n C(O)OR^5$; $-(CH_2)_n C(O)OR^6$; $-(CH_2)_n OR^6$; $-(CH_2)_n OC(O)R^6$; $-(CH_2)_n C(O)R^6$; $-(CH_2)_n OC(O)OR^6$; and any combination of two of $R^1$, $R^2$, $R^3$, and $R^4$ linked together by a linking group. A portion of the repeat units having structural formula I contain at least one epoxy functional pendant group. The copolymer composition can be included with a material that photonically forms a catalyst in a photodefinable dielectric composition, which can be used to form a photodefinable layer on a substrate.

4 Claims, No Drawings

OTHER PUBLICATIONS

S. Rajaraman et al., *Interaction of Epoxy and Vinyl Ethers During Photoinitiated Cationic Polymerization*, Journal of Polymer Science: Part A: Polymer Chemistry, 1999, pp. 4007-4018, vol. 37.

Z. Gomurashvili et al., *Monomeric and Polymeric Phenothiazine Photosensitizers for Photoinitiated Cationic Polymerization*, Macromolecules, 2002, pp. 2962-2969, vol. 35.

* cited by examiner

PHOTOSENSITIVE COMPOSITIONS BASED ON POLYCYCLIC POLYMERS

CROSS-REFERENCE TO RELATED APPLICATION

This application is a divisional of U.S. patent application Ser. No. 10/465,511, filed Jun. 19, 2003, now U.S. Pat. No. 7,022,790, which claims the benefit of U.S. Provisional Application Number 60/393,726, filed Jul. 3, 2002, and entitled "Photosensitive Compositions Based on Polycyclic Polymers," the disclosure of which is hereby incorporated by reference.

BACKGROUND OF THE INVENTION

1. Field of the Invention

The present invention relates to polycyclic polymers and particularly to photodefinable polymer compositions that include polycyclic polymers.

2. Description of Related Art

The rapid development of the microelectronics industry has created a great demand for photodefinable dielectric polymeric materials with improved electrical characteristics for the packaging of each succeeding generation of microelectronic devices. Trends in the industry require integrated circuits that are smaller, faster, and consume less energy. To meet these demands, integrated circuitry and the packaging of such circuitry must be of higher density with sub-micron feature definitions. One method of increasing the number of components per chip is to decrease the minimum feature size on the chip. Consequently, conducting lines must be made thinner and placed in closer proximity to one another. The reduction in spacing between conducting lines in the circuitry and packaging of such circuitry results in a concomitant increase in the efficiency and speed of the circuit enabling greater storage capacity, faster processing of information, and lower energy requirements. However, the reduction in spacing between conducting lines can cause an increase in capacitive coupling of the lines resulting in greater crosstalk, higher capacitive losses, and an increased RC time constant.

In order to limit any such increase in capacitive coupling and deleterious effects such as propagation delays, simultaneous switching noise and the like, considerable interest in high performance polymers having a low dielectric constant has been shown. In addition, interest in such low dielectric constant materials having an appropriate modulus for use in packaging integrated circuitry has also been shown. However, such here to known polymers can often be difficult to pattern, for example, often the etch properties of such low dielectric constant polymers and photoresist compositions used for patterning them are very similar. Accordingly, efforts to selectively remove portions of the polymer can be problematic. To overcome this selectivity problem, it is known to form an interposing material between the polymer and the resist composition where such interposing material can be selectively patterned to form a hard mask which subsequently can be used in the patterning of the underlying polymer material.

The additional steps required to form a hard mask are not cost effective and hence alternate methods for patterning the low dielectric constant polymer material that do not require such steps would be advantageous. To this effect, U.S. Pat. No. 6,121,340 discloses a negative-working photodefinable dielectric composition comprising a photoinitiator and a polycyclic addition polymer comprising repeating units with pendant hydrolyzable functionalities (e.g., silyl ethers). Upon exposure to a radiation source, the photoinitiator catalyzes the hydrolysis of the hydrolyzable groups to effect selective crosslinking in the polymer backbone to form a pattern. Thus the dielectric material of the '340 patent is in and of itself photodefinable. However, the dielectric compositions disclosed in the '340 patent disadvantageously require the presence of moisture for the hydrolysis reaction to proceed. As known, the presence of such moisture in the dielectric layer can lead to reliability problems in completed devices and device packages.

Therefore, it would be desirable to provide low dielectric constant materials having an appropriate modulus for use in the microelectronic industry that are in and of themselves photodefinable but which do not require the presence of moisture to be photodefined. In addition it would be desirable to provide methods for the use of such photodefinable materials and to provide microelectronic devices that employ such photodefineable materials as dielectric materials.

SUMMARY

Exemplary embodiments in accordance with the present invention are directed to polymer compositions encompassing a copolymer containing a backbone having repeat units in accordance with structural formula I:

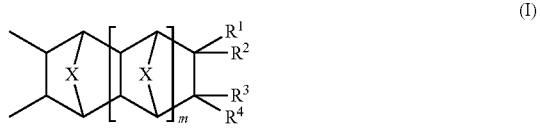

where X is selected from —$CH_2$—, —$CH_2$—$CH_2$— and O; m is an integer from 0 to 5; and each occurrence of $R^1$, $R^2$, $R^3$, and $R^4$ is independently selected from one of the following groups:

(a) H, $C_1$ to $C_{25}$ linear, branched, and cyclic alkyl, aryl, aralkyl, alkaryl, alkenyl, and alkynyl;

(b) $C_1$ to $C_{25}$ linear, branched, and cyclic alkyl, aryl, aralkyl, alkaryl, alkenyl, and alkynyl containing one or more hetero atoms selected from O, N, and Si;

(c) an epoxy containing group of structural formula II:

where A is a linking group selected from $C_1$ to $C_6$ linear, branched, and cyclic alkylene, and $R^{23}$ and $R^{24}$ are independently selected from H, methyl, and ethyl;

(d) an epoxy containing group of structural formula III:

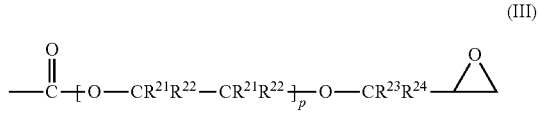

where p is an integer from zero to 6, $R^{23}$ and $R^{24}$ are as defined above, and each occurrence of $R^{21}$ and $R^{22}$ are independently selected from H, methyl and ethyl;

(e) —$(CH_2)_nC(O)OR^5$, —$(CH_2)_nC(O)OR^6$, —$(CH_2)_nOR^6$, —$(CH_2)_nOC(O)R^6$, —$(CH_2)_nC(O)R^6$, and —$(CH_2)_nOC(O)OR^6$; and (f) any combination of two of $R^1$, $R^2$, $R^3$, and $R^4$ linked together by a linking group selected from $C_1$ to $C_{25}$ linear, branched, and cyclic alkylene and alkylene aryl; wherein n is an integer of from 1 to 25, $R^5$ is an acid labile group, $R^6$ is selected from H, $C_1$ to $C_6$ linear, branched, and cyclic alkyl, an epoxy containing group of structural formula II as defined above; and where a portion of the repeat units having structural formula I contain at least one epoxy functional pendant group.

Other examples of the present invention are directed to photodefinable dielectric compositions that include polymer compositions as described above and a material that photonically forms a catalyst.

Further exemplary embodiments of the present invention are directed to methods of forming a photodefinable layer on a substrate and include providing the substrate, coating at least one side of the substrate with a composition that includes the copolymer composition and the material that photonically forms a catalyst described above, exposing the layer on the coated substrate to radiation, and curing the radiation-exposed layer.

Additional examples in accordance with the present invention are directed to electrical or electronic devices containing a layer that includes or is derived from the photodefinable dielectric compositions described above, as well as devices made using methods in accordance with the present invention.

DESCRIPTION OF EXEMPLARY EMBODIMENTS

Unless otherwise indicated, all numbers, values and/or expressions referring to quantities of ingredients, reaction conditions, etc., used herein are to be understood as modified in all instances by the term "about."

Various numerical ranges are disclosed in this patent application. Because these ranges are continuous, they include every value between the minimum and maximum values of each range. Unless expressly indicated otherwise, the various numerical ranges specified in this specification and in the claims are approximations that are reflective of the various uncertainties of measurement encountered in obtaining such values.

As used herein, the term "polymer composition" is meant to include a synthesized copolymer, as well as residues from initiators, catalysts, and other elements attendant to the synthesis of the copolymer, where such residues are understood as not being covalently incorporated thereto. Such residues and other elements considered as part of the polymer composition are typically mixed or co-mingled with the copolymer such that they tend to remain with the copolymer when it is transferred between vessels or between solvent or dispersion media. Polymer composition also includes materials added after synthesis of the copolymer to provide specific properties to the polymer composition.

As used herein, the term "low K composition" refers in general to a material having a low dielectric constant, typically a material with a dielectric constant less than that of thermally formed silicon dioxide and in particular to materials with a dielectric constant of less than about 3.9.

As used herein, the term "Modulus" is understood to mean the ratio of stress to strain and unless otherwise indicated refers to the Young's Modulus or Tensile Modulus measured in the linear elastic region of the stress-strain curve. Modulus values are measured in accordance with ASTM method D1708-95.

As used herein, the terms "acid labile" and "acid labile group" refer to a portion of a molecule, i.e. a group, that will react in the presence of acid in a catalytic manner.

As used herein, the term "photodefinable dielectric composition" refers to a composition capable of forming, in and of itself, a patterned layer on a substrate. That is to say a layer that does not require the use of another material layer formed thereover, for example a photoresist layer, to form the patterned layer. In addition, such a photodefinable dielectric composition is understood as being useable as a permanent insulative material and/or barrier or buffer layer in the preparation of a wide variety of electrical and electronic devices, as a non-limiting example, as a stress buffer layer in a semiconductor device package. As used herein, the photodefinable composition can form layers that can be employed in a pattern forming scheme with a variety of types of electromagnetic radiation, including but not limited to, ultra-violet (UV) radiation, deep ultraviolet (DUV) radiation, an electron beam, or X-ray radiation.

As used herein, the phrase "a material that photonically forms a catalyst" refers to materials that, when exposed to an appropriate form of energy, non-limiting examples being UV radiation, DUV radiation, an electron beam, and X-ray radiation, will break down, decompose, or in some other way alter their molecular composition to form a compound capable of catalyzing a crosslinking reaction in the photodefinable dielectric composition.

As used herein, the term "cure" (or "curing") is intended to refer to crosslinking of the photodefinable dielectric composition components to result in the development of the desired physical and chemical properties of the resultant film, non-limiting examples of such being a low dielectric constant, low moisture uptake properties, low modulus and resistance to chemicals. When processing the polymer composition, the composition may be partially cured in one processing step and the cure 'completed' in a subsequent processing step.

Exemplary embodiments in accordance with the present invention are directed to polymer compositions encompassing a copolymer containing a backbone having repeat units in accordance with structural formula I:

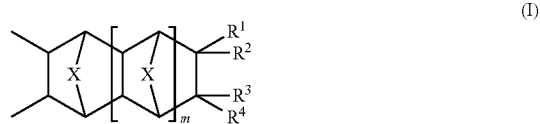
(I)

wherein X is selected from —$CH_2$—, —$CH_2$—$CH_2$— and O; m is an integer from 0 to 5, in some cases 0 to 3, and in other cases 0 to 2. Each occurrence of $R^1$, $R^2$, $R^3$, and $R^4$ in structural formula I are independently selected from one of the following groups:

(a) H, $C_1$ to $C_{25}$ linear, branched, and cyclic alkyl, aryl, aralkyl, alkaryl, alkenyl, and alkynyl;

(b) $C_1$ to $C_{25}$ linear, branched, and cyclic alkyl, aryl, aralkyl, alkaryl, alkenyl, and alkynyl containing one or more hetero atoms selected from O, N, and Si;

(c) an epoxy containing group of structural formula II:

(II)

wherein A is a linking group selected from $C_1$ to $C_6$ linear, branched, and cyclic alkylene and $R^{23}$ and $R^{24}$ are independently selected from H, methyl, and ethyl;

(d) an epoxy containing group of structural formula III:

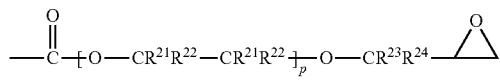

(III)

wherein p is an integer from zero to 6, $R^{23}$ and $R^{24}$ are as defined above, and each occurrence of $R^{21}$ and $R^{22}$ are independently selected from H, methyl, and ethyl;

(e) $-(CH_2)_nC(O)OR^5$, $-(CH_2)_nC(O)OR^6$, $-(CH_2)_nOR^6$, $-(CH_2)_nOC(O)R^6$, $-(CH_2)_nC(O)R^6$, and $-(CH_2)_nOC(O)OR^6$; and (f) any combination of two of $R^1$, $R^2$, $R^3$, and $R^4$ linked together by a linking group selected from $C_1$ to $C_{25}$ linear, branched, and cyclic alkylene and alkylene aryl; wherein n is an integer of from 1 to 25, $R^5$ is an acid labile group, and $R^6$ is selected from H, $C_1$ to $C_6$ linear, branched, and cyclic alkyl, an epoxy containing group of structural formula II as defined above. In the inventive copolymer, a portion of the repeat units having structural formula I contain at least one epoxy functional pendant group.

Such exemplary embodiments can encompass a copolymer containing 65-75 mole % of a first repeat unit of structural formula I, where R, $R^2$, and $R^3$ are H, and $R^4$ is decyl, and 25-35 mole % of a second repeat unit of structural formula I, wherein $R^1$, $R^2$, and $R^3$ are H, and $R^4$ is an epoxy containing group of structural formula II, wherein A is methylene and $R^{23}$ and $R^{24}$ are H.

In structural formula I, any of $R^1$, $R^2$, $R^3$, and $R^4$ can have a structure according to the formula $-(CH_2)_nC(O)OR^5$, where $R^5$ is an acid labile group, i.e., a group that will react to from a carboxylic acid group in the presence of acid in a catalytic manner. $R^5$ can be any suitable acid labile group and includes, but is not limited to, $-C(CH_3)_3$, $-Si(CH_3)_3$, $-CH(R^7)CH_2CH_3$, $-CH(R^7)C(CH_3)_3$, dicyclopropylmethyl, dimethylcyclopropylinethyl, and a compound described by one or more of structural formulas IV-X:

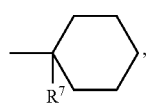

(IV)

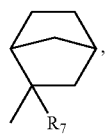

(V)

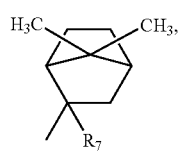

(VI)

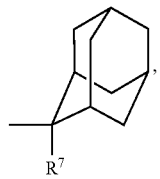

(VII)

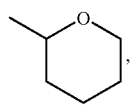

(VIII)

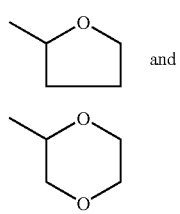

(IX) and (X)

where $R^7$ is selected from H and $C_1$ to $C_6$ linear, branched, and cyclic alkyl.

In another exemplary embodiment in accordance with the present invention, the copolymer backbone further includes one or more repeat units selected from repeat units having structural units XI-XV:

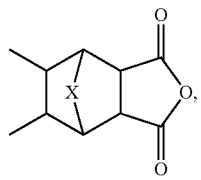

(XI)

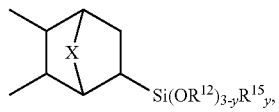

(XII)

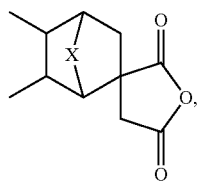

(XIII)

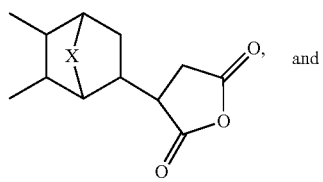

(XIV) and

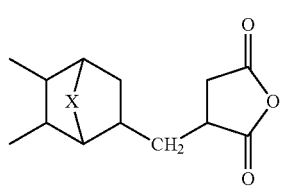

(XV)

where X is defined as above, y is 0, 1, or 2; $R^{12}$ is selected from $C_1$ to $C_6$ linear, branched, and cyclic alkyl; and $R^{15}$ is selected from H and $C_1$ to $C_4$ linear and branched alkyl.

Further to this examplary embodiment, when the copolymer includes one or more of repeat units XI-XV, those repeat units are present at a level of at least 1 mole %, in some cases at least 2 mole %, and in other cases at least 3 mole % of the copolymer. Also, the copolymer includes one or more of repeat units XI-XV at a level of up to 10 mole %, in some cases up to 9 mole %, in other cases up to 7 mole %, and in some situations up to 5 mole %. One or more of repeat units XI-XV can be present in the copolymer between any range of values recited above.

Embodiments of the copolymer encompass repeat units in accordance with structural formula I that contain an epoxy functional group. Advantageously, the epoxy groups, when suitably catalyzed, crosslink with neighboring epoxy groups to give a crosslinked polymer that is resistant to solvent attack. Such repeat units containing epoxy functional groups are included in the copolymer at a level of at least 20 mole %, in some cases at least 25 mole %, and in other cases at least 35 mole % of the copolymer. Also, the repeat units containing epoxy functional groups are included in the copolymer at a level of up to 95 mole %, in some cases up to 75 mole %, in other cases 60 mole %, in some situations up to 50 mole %, and in other situations up to 35 mole % of the copolymer. The amount of epoxy functional groups in the copolymer is determined based on the physical properties desired in the copolymer and/or photodefinable layers and cured layers containing or derived from the copolymer. The amount of epoxy functional groups in the copolymer can vary between any of the values recited above.

Such copolymer embodiments have excellent physical properties, particularly for use in photodefinable compositions for electrical or electronic devices. For example low moisture absorption (less than 2 weight percent), low dielectric constant (less than 3.9 low modulus (less than 3 GigaPascal (GPa)), low cure temperature (less than 200° Celsius (C.)) and good solubility in many common organic solvents.

In an examplary embodiment of the present invention, the polymer composition is a low K composition. As a low K composition, the polymer composition, photodefinable dielectric compositions containing the polymer composition, and/or cured layers and/or films derived from such photodefinable dielectric compositions have a dielectric constant of less than 3.9. The dielectric constant of the polymer composition, photodefinable dielectric compositions containing the polymer composition, and/or cured layers and/or films derived from such photodefinable dielectric compositions are typically at least 2.2, in some cases at least 2.3, and in other cases at least 2.5. Also, the dielectric constant of the polymer composition, photodefinable dielectric compositions containing the copolymer, the polymer composition, and/or cured layers and/or films derived from such photodefinable dielectric compositions can be up to 3.3, in some cases up to 2.9, and in other cases up to 2.6. The dielectric constant is sufficiently low to provide reduction of transmission delays and alleviation of crosstalk between conductive lines in electrical and/or electronic devices containing the inventive polymer composition. The dielectric constant of the copolymer, the polymer composition, photodefinable dielectric compositions containing the polymer composition, and/or cured layers and/or films derived from such photodefinable dielectric compositions can vary between any of the values recited above.

In an examplary embodiment of the present invention, the modulus of the copolymer, the polymer composition, the photodefinable dielectric compositions containing the copolymer, and/or cured layers and/or films derived from such photodefinable dielectric compositions are typically at least 0.1 GPa, in some cases at least 0.2 GPa, and in other cases at least 0.3 GPa. Also, the modulus of the copolymer, the polymer composition, photodefinable dielectric compositions containing the copolymer, and/or cured layers and/or films derived from such photodefinable dielectric compositions can be up to 3 GPa, in some cases up to 1 GPa, and in other cases up to 0.7 GPa. When the modulus is too low, the material has a rubbery consistency and can be difficult to handle in production. When the modulus is too high, high stress can be caused, leading to reliability issues. The modulus of the copolymer, the polymer composition, photodefinable dielectric compositions containing the copolymer, and/or cured layers and/or films derived from such photodefinable dielectric compositions can vary between any of the values recited above.

In other examplary embodiments, the polymer compositions are photodefinable dielectric compositions containing polymer compositions and/or cured layers and/or films derived from such photodefinable dielectric compositions that have a moisture absorption of less than 2 weight percent, in some cases less than 0.8 weight percent, and in other cases less than 0.3 weight percent. It will be understood that such embodiments provide for improved resistance to moisture absorption when compared to other previously known photodefinable definable polymeric materials.

As indicated above, epoxy functional group mole % in the copolymer backbone determines many physical properties of the copolymer and/or photodefinable layers and cured layers containing or derived from the copolymer. As a non-limiting example, when the copolymer contains from 15 mole % to 95 mole % repeat units containing epoxy groups, the copolymer typically has a moisture absorption of less than 2 weight percent and a dielectric constant of less than 3.3. In further non-limiting examples, when the copolymer includes repeat units containing an epoxy at a level of from 20 mole % to 60 mole %, the copolymer has a moisture absorption of less than 0.8 weight percent and a dielectric constant of less than 2.9; and when the copolymer includes repeat units containing an epoxy at a level of from 25 mole % to 35 mole %, the copolymer has a moisture absorption of less than 0.3 weight percent and a dielectric constant of less than 2.6.

As used herein, "moisture absorption" is determined by measuring weight gain in accordance with ASTM D570-98.

Copolymers in accordance with the present invention have a glass transition temperature of at least 170° C., in some cases at least 200° C., and in some cases at least 220° C. Also, the inventive copolymer has a glass transition temperature of up to 350° C., in some cases up to 325° C., in other cases up to 300° C., and in some situations up to 280° C. The copolymer has a glass transition temperature that allows for processing of the polymer composition, photodefinable compositions containing the copolymer, and cured layers containing the copolymer. As a non-limiting example, the glass transition temperature is sufficient to allow successful solder reflow during microchip production. The glass transition temperature of the copolymer can vary between any of the values indicated above. As referred to herein, the glass transition temperature of the copolymer is determined using Dynamic Mechanical Analysis (DMA) on a Rheometric Scientific Dynamic Analyzer Model RDAII available from TA Instruments, New Castle, Del. according to ASTM D5026-95 (temperature: ambient to 400° C. at a rate of 5° C. per minute).

Copolymers in accordance with the present invention have a weight average molecular weight (Mw) of at least 10,000, in some cases at least 30,000, in other cases at least 50,000, in some situations at least 70,000, and in other situations at least 90,000. Also, such copolymers have a Mw of up to 500,000, in some cases up to 400,000, in other cases up to 300,000, in some situations up to 250,000, and in other situations up to 140,000. Mw is determined by gel permeation chromatography (GPC) using poly(norbornene) standards. The Mw of the copolymer is sufficient to provide the desired physical properties in the copolymer and/or photodefinable layers and cured layers containing or derived from the copolymer. The Mw of the copolymer can vary between any of the values stated above.

In an exemplary embodiment, the polymer composition also includes a solvent selected from reactive and non-reactive compounds. The solvent can be one or more of hydrocarbon solvents, aromatic solvents, cycloaliphatic cyclic ethers, cyclic ethers, acetates, esters, lactones, ketones, amides, aliphatic mono- and multivinyl ethers, cycloaliphatic mono- and multivinyl ethers, aromatic mono- and multivinyl ethers, cyclic carbonates, and mixtures thereof. Particular non-limiting examples of solvents that can be used include cyclohexane, benzene, toluene, xylene, mesitylene, tetrahydrofuran, anisole, terpenenoids, cyclohexene oxide, α-pinene oxide, 2,2'-[methylenebis(4,1-phenyleneoxymethylene)]bis-oxirane, 1,4-cyclohexanedimethanol divinyl ether, bis(4-vinyloxyphenyl)methane, cyclohexanone, and decalin.

Exemplary embodiments of the present invention encompass polymer compositions that are photonically catalysed negative-working photosensitive polymer compositions useful as a protective coating for substrates used in printing wiring board applications, including redistribution layers for build up multilayer devices and high density interconnect microvia substrates. Further to such examplary embodiments, the polymer compositions can be a photodefinable polymer composition that can be applied and patterned as a dielectric layer for the packaging of integrated circuits to protect against environmental and mechanical stresses. Additionally, the photodefinable compositions are useful as redistribution layers, passivation layers, and stress buffer materials for conventional, chip scale, and wafer level packaging of logic, Application Specific Integrated Circuits (ASICs), discrete, memory, and passive devices. Thus, the photodefinable polymer compositions can be used in the fabrication of electronic devices, which incorporate the photodefined polymer compositions as active (e.g., stress buffer materials) or passive (e.g., passivation layer(s)) components.

The inventive copolymer can be prepared by vinyl-addition polymerization. A monomer composition that includes polycycloolefin monomers as described in structure I and, optionally, structures XI-XV are polymerized in solution in the presence of a desired catalyst. Vinyl-addition catalysts useful in preparing the inventive copolymer include nickel and palladium compounds as disclosed in PCT WO 97/33198 and PCT WO 00/20472.

A non-limiting example of a vinyl-addition catalyst useful in making the copolymers utilized in this invention is represented by the formula:

where n' is 1 or 2 and E represents a neutral 2 electron donor ligand. When n' is 1, E preferably is a pi-arene ligand such as toluene, benzene, and mesitylene. When n' is 2, E is preferably selected from diethyl ether, THF (tetrahydrofuran), ethyl acetate (EtOAc), and dioxane. The ratio of monomer to catalyst in the reaction medium can range from about 5000:1 to about 50:1 in an exemplary embodiment of the invention, and in another exemplary embodiment at a ratio of about 2000:1 to about 100:1. The reaction can be run in a suitable solvent at a temperature range from about 0° C. to about 70° C. In an exemplary embodiment, the temperature can range from about 10° C. to about 50° C., and in another exemplary embodiment from about 20° C. to about 40° C. Catalysts of the above formula that can be used to make the inventive copolymers include, but are not limited to, (toluene)bis(perfluorophenyl) nickel, (mesitylene)bis(perfluorophenyl) nickel, (benzene)bis(perfluorophenyl) nickel, bis(tetrahydrofuran)bis(perfluorophenyl) nickel, bis(ethyl acetate)bis(perfluorophenyl) nickel, and bis(dioxane)bis(perfluorophenyl) nickel.

Suitable polymerization solvents for the free radical and vinyl addition polymerization reactions include, but are not limited to, hydrocarbon and aromatic solvents. Hydrocarbon solvents useful in the invention include, but are not limited to, to alkanes and cycloalkanes such as pentane, hexane, heptane, and cyclohexane. Non-limiting examples of aromatic solvents include benzene, toluene, xylene, and mesitylene. Other organic solvents such as diethyl ether, tetrahydrofuran, acetates, e.g., ethyl acetate, esters, lactones, ketones, and amides are also useful. Mixtures of one or more of the foregoing solvents can be utilized as a polymerization solvent.

When utilizing the vinyl-addition nickel catalyst disclosed above, the molecular weight of the polymer can be controlled by employing a molecular weight modifying agent such as is disclosed in U.S. Pat. No. 6,136,499, the disclosure of which is herein incorporated by reference in its entirety. In one aspect of the invention, α-olefins, (e.g., ethylene, propylene, 1-hexene, 1-decene, and 4-methyl-1-pentene) are suitable for molecular weight control.

As indicated above, exemplary embodiments of the present invention are also directed to photodefinable dielectric compositions that include an embodiment of the copolymer and a material that photonically forms a catalyst.

Any suitable material that photonically forms a catalyst can be used in the present invention. Non-limiting examples of suitable materials that form a catalyst photonically include photoacid generators and photobase generators.

When a photoacid generator is used as the material that photonically forms a catalyst, the photoacid generator can include one or more compounds selected from onium salts, halogen-containing compounds, and sulfonates. In an exemplary embodiment of the present invention, the photoacid generator includes one or more compounds selected from 4,4'-ditertiarybutylphenyl iodonium triflate; 4,4',4"-tris(tertiary butylphenyl)sulphonium triflate; diphenyliodonium tetrakis(pentafluorophenyl)sulphonium borate; triarylsulphonium-tetrakis(pentafluorophenyl)-borate; triphenylsulfonium tetrakis(pentafluorophenyl)sulphonium borate; 4,4'-ditertiarybutylphenyl iodonium tetrakis(pentafluorophenyl)borate; tris(tertiary butylphenyl)sulphonium tetrakis(pentafluorophenyl)borate, and 4-methylphenyl-4-(1-methylethyl)phenyl iodonium tetrakis(pentafluorophenyl)borate.

Such photoacid generators are present at a level sufficient to promote curing and crosslinking. Thus, when such photoacid generators are employed in the photodefinable dielectric composition, such are present in an amount of at least 0.5 percent by weight, in some cases at least 0.75 percent by weight, and in other cases at least 1 percent by weight of the photodefinable dielectric composition. In some embodiments, the photoacid generator is present in an amount of up to 10 percent by weight, in some cases up to 7.5 percent by weight, and in other cases up to 5 percent by weight of the photodefinable dielectric composition. The amount of photoacid generator present in the photodefinable dielectric composition can vary between any of the values recited above.

Embodiments of copolymers in accordance with the present invention are present in the photodefinable dielectric composition at a level sufficient to provide the above-described desired physical properties to the resulting composition, as well as coated layers and cured layers formed from the photodefinable dielectric composition. In an examplary embodiment of the present invention, the embodiment of the copolymer is present in the photodefinable dielectric composition in an amount of at least 5 percent by weight, in some cases at least 15 percent by weight, and in other cases at least 25 percent by weight of the photodefinable dielectric composition. Also, the copolymer is present in the photodefinable dielectric composition in an amount of up to 65 percent by weight, in some cases up to 60 percent by weight, and in other cases up to 55 percent by weight of the photodefinable dielectric composition. The amount of the copolymer embodiment present in the photodefinable dielectric composition can vary between any of the values recited above.

It will be understood that exemplary embodiments of the present invention, can include other suitable components and/or materials such as are necessary for formulating and using the photodefinable dielectric compositions in accordance with the present invention. Such other suitable components and/or materials include one or more components selected from sensitizer components, solvents, catalyst scavengers, adhesion promoters, antioxidants, fire retardants, stabilizers, reactive diluents, and plasticizers.

Where appropriate, any suitable sensitizer component can be included in the photodefinable dielectric compositions of the present invention. Such suitable sensitizer components include, but are not limited to, anthracenes, phenanthrenes, chrysenes, benzpyrenes, fluoranthenes, rubrenes, pyrenes, xanthones, indanthrenes, thioxanthen-9-ones, and mixtures thereof. In some exemplary embodiments, suitable sensitizer components include 2-isopropyl-9H-thioxanthen-9-one, 4-isopropyl-9H-thioxanthen-9-one, 1-chloro-4-propoxythioxanthone, phenothiazine, and mixtures thereof.

In exemplary embodiments of the present invention having both a material that photonically forms a catalyst and a sensitizer component, the latter can be present in the photodefinable dielectric composition in an amount of at least 0.1 percent by weight, in some cases at least 0.5 percent by weight, and in other cases at least 1 percent by weight of the photodefinable dielectric composition. Also, the sensitizer component is present in the photodefinable dielectric composition in an amount of up to 10 percent by weight, in some cases up to 7.5 percent by weight, and in other cases up to 5 percent by weight of the photodefinable dielectric composition. The amount of sensitizer component present in the photodefinable dielectric composition in this exemplary embodiment can vary between any of the values recited above.

When a catalyst scavenger is used embodiments of the photodefinable dielectric composition, it can include an acid scavenger and/or a base scavenger. A non-limiting example of a suitable base scavenger that can be used in the present invention is trifluoro methylsulfonamide. Non-limiting examples of acid scavengers that can be used in the present invention include secondary amines and/or tertiary amines such as those selected from pyridine, phenothiazine, tri(n-propyl amine), triethylamine, and lutidine in any of its isomeric forms.

In exemplary embodiments of the present invention having both a material that photonically forms a catalyst and a catalyst scavenger, the latter can be present in the photodefinable dielectric composition in an amount of at least 0.1 percent by weight, in some cases at least 0.25 percent by weight, and in other cases at least 0.5 percent by weight of the photodefinable dielectric composition. Also, the catalyst scavenger is present in the photodefinable dielectric composition in an amount of up to 5 percent by weight, in some cases up to 4 percent by weight, and in other cases up to 3.5 percent by weight, of the photodefinable dielectric composition. The amount of catalyst scavenger present in the photodefinable dielectric composition in this exemplary embodiment can vary between any of the values recited above.

In exemplary embodiments of the present invention, the solvent includes suitable reactive and/or non-reactive compounds. Suitable solvent compounds include, but are not limited to, hydrocarbon solvents, aromatic solvents, cycloaliphatic cyclic ethers, cyclic ethers, acetates, esters, lactones, ketones, amides, cycloaliphatic vinyl ethers, aromatic vinyl ethers, cyclic carbonates and mixtures thereof. In this exemplary embodiment, the suitable solvent compounds include one or more of cyclohexane, benzene, toluene, xylene, mesitylene, tetrahydrofuran, anisole, cyclohexene oxide, α-pinene oxide, 2,2'-[methylenebis(4,1-phenyleneoxymethylene)]bis-oxirane, 1,4-cyclohexanedimethanol divinyl ether, bis(4-vinyloxyphenyl)methane, cyclohexanone, and decalin.

In an exemplary embodiment of the present invention, the solvent is present in the photodefinable dielectric composition in an amount of at least 20 percent by weight, in some cases at least 30 percent by weight, in other cases at least 40 percent by weight, in some situations at least 45 percent by weight, and in other situations at least 50 percent by weight of the photodefinable dielectric composition. The solvent is present in an amount sufficient to provide desired rheological properties, a non-limiting example being viscosity, to the photodefinable dielectric composition. Also, the solvent is present in the photodefinable dielectric composition in an amount of up to 95 percent by weight, in some cases up to 80 percent by weight, in other cases up to 70 percent by weight, and in some situations up to 60 percent by weight of the photodefinable dielectric composition. The amount of solvent present in the photodefinable dielectric composition in this exemplary embodiment can vary between any of the values recited above.

Any suitable adhesion promoter can be used in the present invention. Suitable adhesion promoters improve the bond strength between a coated layer of photodefinable dielectric composition and the substrate upon which it is coated. In an exemplary embodiment of the present invention, the adhesion promoter includes one or more compounds selected from 3-aminopropyl triethoxysilane and compounds described by structural unit XVI:

(XVI)

wherein z is 0, 1, or 2; $R^8$ is a linking group selected from $C_1$ to $C_{20}$ linear, branched, and cyclic alkylene, alkylene oxide containing from 2 to 6 carbon atoms, and poly(alkylene oxide), wherein the alkylene portion of the repeat groups contains from 2 to 6 carbon atoms and the poly(alkylene oxide) has a molecular weight of from 50 to 1,000; each occurrence of $R^9$ is independently selected from $C_1$ to $C_4$ linear and branched alkyl; and each occurrence of $R^{18}$ is selected from H and $C_1$ to $C_4$ linear and branched alkyl.

Any suitable reactive diluent can be used in the present invention. Suitable reactive diluents improve one or more of the physical properties of the photodefinable dielectric composition and/or coating layers formed from the photodefinable dielectric composition. In some exemplary embodiments, the reactive diluents include one or more compounds selected from epoxides and compounds described by structural units XVII and XVIII:

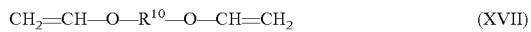  (XVII)

  (XVIII)

where $R^{10}$ is a linking group selected from $C_1$ to $C_{20}$ linear, branched, and cyclic alkylene, arylene and alkylene aryl, alkylene oxide containing from 2 to 6 carbon atoms, poly (alkylene oxide), wherein the alkylene portion of the repeat groups contain from 2 to 6 carbon atoms and the poly(alkylene oxide) has a molecular weight of from 50 to 1,000, —[—$R^{13}$—N—C(O)—O—]$_m$—$R^{13}$—, wherein each occurrence of $R^{13}$ is independently selected from $C_1$ to $C_{20}$ linear, branched, and cyclic alkylene, arylene, and alkylene aryl, and m is an integer of from 1 to 20; and $R^{11}$ is selected from $C_1$ to $C_{20}$ linear and branched, alkyl, and alkylol.

In a further exemplary embodiments, the reactive diluents include one or more reactive diluents selected from 1,4-butanediol divinyl ether, 1,6-hexanediol divinyl ether, 1,8-octanediol divinyl ether, 1,4-dimethanolcyclohexane divinyl ether, 1,2-ethylene glycol divinyl ether, 1,3-propylene glycol divinyl ether, ethyl vinyl ether, propyl vinyl ether, butyl vinyl ether, isobutyl vinyl ether, cyclohexyl vinyl ether, octyl vinyl ether, decyl vinyl ether, dodecyl vinyl ether, octadecyl vinyl ether, 1,4-butanediol vinyl ether, 1,6-hexanediol vinyl ether, and 1,8-octanediol vinyl ether.

In exemplary embodiments of the present invention, the reactive diluent is present in the photodefinable dielectric composition in an amount of at least 0.5 percent by weight, in some cases at least 1 percent by weight, in other cases at least 2.5 percent by weight, in some situations at least 5 percent by weight, and in other situations at least 7.5 percent by weight of the photodefinable dielectric composition. The reactive diluent is present in an amount sufficient to provide desired physical properties to the photodefinable dielectric composition and coating layers formed from the photodefinable dielectric composition. Also, the reactive diluent is present in the photodefinable dielectric composition in an amount of up to 95 percent by weight, in some cases up to 60 percent by weight, in other cases up to 30 percent by weight, and in some situations as little as 1 percent by weight of the photodefinable dielectric composition. The amount of reactive diluent present in the photodefinable dielectric composition in this exemplary embodiment can vary between any of the values recited above.

When the photodefinable dielectric composition includes a solvent and/or a reactive diluent, the photodefinable dielectric composition is in a fluid liquid solution form. In an exemplary embodiment of the present invention, the solution viscosity of the photodefinable dielectric composition is at least 10 centipoise (cps), in some cases at least 100 cps, and in other cases at least 500 cps. Also, the solution viscosity of the photodefinable dielectric composition is up to 25,000 cps, in some cases up to 20,000 cps, in other cases up to 15,000 cps, in some situations up to 10,000 cps, in other situations up to 5,000 cps, and in some circumstances up to 3,000 cps. The solution viscosity is determined at 25° C. using a suitable spindle on a Brookfield DV-E viscometer, available from Brookfield Engineering Laboratories, Middleboro, Mass. The viscosity of an amount of the photodefinable dielectric composition in this exemplary embodiment can vary between any of the values recited above.

An exemplary embodiment of the present invention is directed to a method of forming a photodefinable layer on a substrate. The method includes the steps of providing a substrate, coating at least one side of the substrate with the photodefinable dielectric composition described above, exposing the coated layer to radiation, and curing the radiation-exposed layer.

Any suitable method of coating may be used to coat the substrate with the photodefinable dielectric composition. In an exemplary embodiment, suitable coating methods include, but are not limited to, spin coating, dip coating, brush coating, roller coating, spray coating, solution casting, fluidized bed deposition, extrusion coating, curtain coating, meniscus coating, screen or stencil printing and the like. In an exemplary embodiment of the present invention, spin coating and curtain coating are used because of their simplicity and high uniformity. Cast films from this embodiment of the photodefinable dielectric composition have superior properties such as toughness, craze resistance to solvents, infrequent pinhole defects, excellent planarity, and adhesion among other properties.

The coated layer can be exposed using any suitable source of energy for exposure. Suitable sources include radiation. Non-limiting examples of radiation sources include, but are not limited to, photon radiation and/or an electron beam. In a non-limiting example the photon radiation is ultraviolet radiation at a wavelength of from 200 nm to 700 nm, in some cases 300 nm to 500 nm, and in other cases from 360 nm to 440 nm. In a further non-limiting example, the dose of radiation for exposing is from 50 mJ/cm² to 2,000 mJ/cm².

In an exemplary embodiment, the method of forming a photodefinable layer on a substrate includes the step of defining a pattern in the cured layer. As a non-limiting example, the pattern can be defined by imagewise exposing the layer. In an exemplary embodiment, when the layer is imagewise exposed, it is typically imaged through a photomask by photon radiation, non-limiting examples of which include electron beam, x-ray, ultraviolet, or visible radiation. Suitable radiation sources include mercury, mercury/xenon, xenon lamps, KrF laser, x-ray, or e-beam. Imagewise exposure of the photodefinable dielectric composition of the invention can be accomplished at many different wavelengths as indicated above. In areas where the photodefinable coating is struck by photon radiation, the sensitizer or photoacid generator becomes active, inducing the formation of a free acid. The free acid catalyzes the crosslinking of the pendant epoxy groups on the polymer backbone, in turn, converting the photon-patterned areas of the polymer from a solvent soluble state to a solvent insoluble state. The soluble areas (non-photon-patterned areas of the polymer) are easily removed with an appropriate solvent developer.

In an exemplary embodiment, the method of forming a photodefinable layer on a substrate includes the step of developing the layer. Any suitable solvent developer may be used in the present invention. Suitable developers are those that are able to remove the soluble portion of the cured layer formed from the photodefinable dielectric composition. Suitable developers include, but are not limited to, toluene, mesitylene, xylene, decalin, limonene and BioAct EC-7R (a limonene based solvent composition formulated with surfactants) available from Petroferm, Inc., Fernandina Beach, Fla.

Any suitable solvent development method can be used in the present invention. In an exemplary embodiment, suitable solvent development methods include, but are not limited to, spray, puddle, and/or immersion techniques. Spray development includes the step of spraying the patterned polymer coated substrate with a continuous stream of atomized or otherwise dispersed stream of developing solvent for a period of time sufficient to remove the non-crosslinked polymer from the substrate. The polymer coated substrate can be subjected to a final rinse with an appropriate solvent such as an alcohol. The puddle and immersion technique involves puddling developing solvent over the entire patterned coating or immersing the patterned coated substrate into developing solvent to dissolve the non-crosslinked polymer, and then rinsing the developed substrate in additional developing solvent or another appropriate solvent (e.g., an alcohol). In all of the foregoing development techniques, the developed coated substrate can be spun at high speed to remove residual solvent and solute.

The present method of forming a photodefinable layer on a substrate includes a curing step. In an exemplary embodiment of the present invention, the curing step follows the imagewise exposure step. The curing step can include a bake cycle. The bake cycle can increase the reaction rate of the epoxy crosslinking reaction. The acid species from the photoacid generators have increased mobility during the cure cycle, allowing the acid to find and react with non-crosslinked epoxy functionality, thereby further enhancing the pattern definition. In exemplary embodiments of the invention, the curing step is conducted in an oven under inert atmosphere (e.g., nitrogen, argon, or helium) at a temperature of from about 50° C. to 200° C. for a period of time between 5 minutes and 60 minutes; or from about 100° C. to about 150° C. for a period of time between 10 minutes and 40 minutes; or from about 110° C. to about 130° C. for between 15 minutes and 30 minutes; or from about 90° C. to about 200° C. for a period of from 1 minute to 60 minutes.

When the photodefinable layer has been exposed to radiation and cured, the layer is in the form of a film covering at least a portion of a surface of the substrate. The film may have any suitable film thickness, typically determined to provide for the number, orientation, and configuration of conducting lines in the photodefined product. In an exemplary embodiment, films formed as described above have a thickness of at least 0.1 microns, in some cases at least 0.2 microns, and in other cases at least 0.5 microns. Also, films formed according to the present invention have a thickness of up to 500 microns, in some cases up to 400 microns, in other cases up to 300 microns, in some situations up to 250 microns, in other situations up to 200 microns, in some circumstances up to 100 microns, and in other circumstances up to 50 microns. In an exemplary embodiment, film thickness is a function of solution concentration, spin speed, and time in spin coating. The film thickness of the radiation exposed and cured photodefinable layer in this exemplary embodiment can vary between any of the values recited above.

In an exemplary embodiment of the method of forming a photodefinable layer on a substrate includes a softbake cycle. In this exemplary embodiment, the softbake cycle is employed to remove residual solvents. The softbake cycle also relaxes stress resulting from the flow of the photodefinable layer film, increases the film's adhesion to the substrate, and hardens the film for more convenient handling during processing. The softbake cycle is carried out under any suitable conditions. Suitable conditions include those sufficient to remove residual solvent, but able to avoid oxidizing or thermal curing of the resin or undesired reactions of the formulation additives, and which allows the resin to flow sufficiently to promote planarization. The conditions will vary depending in part on the components of the polymer containing formulation. Suitable softbake conditions include, but are not limited to, temperatures of at least 90° C., in some cases at least 100° C., and in other cases at least 110° C. and up to 140° C., in some cases up to 130° C., and in other cases up to 120° C. for at least 1 minute, in some cases at least 2 minutes, in other cases at least 5 minutes and up to 30 minutes, in some cases up to 20 minutes, and in other cases up to 10 minutes. The softbake can be performed in a convection oven, belt oven, or on a hot plate. Suitable softbake atmospheres include a vacuum, solvent vapor, air, and inert gas atmosphere such as nitrogen, argon, and helium.

In an exemplary embodiment of the method of forming a photodefinable layer on a substrate, the method includes a final cure step. In this step, the solvent developed coated substrate is post baked in an oven under inert atmosphere (e.g., nitrogen, argon, or helium) at a temperature ranging from about 50° C. to about 200° C., and in some cases 100° C. to 200° C. to achieve a final cure and to remove any residual developing and/or rinsing solvent. In some embodiments it is found that including a blanket exposure of the layer as part of the final cure step is effective in achieving the final cure. Generally such exposure is in addition to the thermal post bake and has is of a range of energies from about 200 mJ to about 500 mJ, inclusive.

As a result of the various curing steps and as a result of the cumulative effect of the various curing steps, the crosslinking reaction is completed as the thermosetting epoxy polymer continues to react. In an exemplary embodiment of the present invention, after the final cure step, the glass transition temperature of the crosslinked polymer film has been increased from 180° C. to greater than 250° C. As is known to those skilled in the art, the final glass transition temperature of a thermoset polymer is typically equivalent to the cure temperature used for the final cure. This is due to the limitations of molecular mobility as the curing polymer changes from a rubbery solid to a glassy solid at the Tg. A significant advantage of the present photodefinable compositions is that the final cure temperature is below the Tg of the uncrosslinked polymer solid, and yet an increase in the Tg of up to 70° C. is observed by dynamic mechanical analysis (DMA) after the crosslinking reaction is completed.

In an exemplary embodiment of the present invention and in lieu of photoimaging and subsequent pattern development, the desired feature definitions can be created by well-known etching techniques onto crosslinked films deposited from the polymer compositions of the present invention. In this exemplary embodiment, a polymer composition layer is formed by steps including providing a substrate, fixing a film to the substrate by depositing a solution containing a material that photonically forms a catalyst and the inventive polymer composition, and thermally curing the solution.

In the "in lieu of photoimaging" exemplary embodiment, the method can include a softbaking step as described above. In this exemplary embodiment, instead of photo-crosslinking the deposited coating or film in desired areas, the entire film is thermally crosslinked. Selected feature definitions are subsequently patterned into the crosslinked film by a suitable etching technique, such as, for example, reactive ion etching (R.I.E.) or laser ablation at selected wavelengths. The thermal crosslinking reaction is initiated by a thermal curing agent which generates an acid upon thermal activation. The thermally generated acid in turn catalyzes the crosslinking reaction of the epoxy functionality. The thermal curing agents or thermal acid generators include many of the photoacid generators set forth above. In addition to photo-activation, it is well known that photoacid generators can be activated at elevated temperatures. Generally, the activation temperatures range from about 25° C. to about 250° C. Suitable thermal acid generators include the onium salts, halogen containing compounds and sulfonates set forth above. It should be apparent to those skilled in the art that any thermally activated initiator can be employed so long as it is capable of initiating a crosslinking reaction of the epoxy functionality on the polymer backbone. Examples of such thermal curing agents or thermal acid generators include, but are not limited to, imidazoles, primary, secondary, and tertiary amines, quaternary ammonium salts, anhydrides, polysulfides, polymercaptans, phenols, carboxylic acids, polyamides, quaternary phosphonium salts, and combinations thereof.

The coated, patterned, developed, and cured films of the present invention have superior properties such as a low dielectric constant, low moisture absorption, toughness, craze resistance to solvents, and adhesion among other properties. Polymer films with at least some of these properties are useful in the fabrication of microelectronic devices where high-density packaging, interconnection, and fine features such as microvias are required.

Layers formed from the photodefinable dielectric composition of the invention and cured and patterned layers and films made using the methods described herein, together with their associated substrates, are useful as or as components of electrical and/or electronic devices. In an exemplary embodiment of the invention, the electrical and/or electronic devices are semiconductor devices. In another exemplary embodiment, the electrical or electronic devices are selected from a logic chip, a passive device, a memory chip, a microelectromechanical system (MEMS) chip, a microoptoelectromechanical systems (MOEMS) chip, and an application specific integrated circuit (ASIC) chip.

The following examples are for illustrative purposes and are not intended to limit the invention in any way. Ratios of repeating units incorporated into the polymer backbones are given in molar weight percent.

EXAMPLES

Example 1

Polymer Synthesis

This example illustrates the synthesis of a 50/50 copolymer polymerized from decyl norbornene/glycidyl methyl ether norbornene). All glassware was dried at 60° C. under a 0.1 torr vacuum for 18 hours. The glassware was then transferred into a glovebox and the reaction vessel was assembled inside the glovebox. Ethyl acetate (917 g), cyclohexane (917 g), decyl norbornene (137 g, 0.585 mol) and glycidyl methyl ether norbornene (105 g, 0.585 mol) were added to the reaction vessel. The reaction vessel was removed from the glove box and connected to a dry nitrogen line. The reaction medium was degassed by passing a stream of nitrogen gas through the solution for 30 minutes. Inside the glovebox, 9.36 g (19.5 mmol) of a nickel catalyst, i.e., bis(toluene)bis(perfluorophenyl) nickel, was dissolved in 15 ml of toluene, taken up in a 25 mL syringe, removed from the glovebox and injected into the reactor. The reaction was stirred at 20° C. for 5 hours. At this time peracetic acid (50 molar equivalents based on the nickel catalyst—975 mmol) solution (glacial acetic acid diluted with approximately 750 ml deionized water and 33 g of 30 wt. % hydrogen peroxide diluted with approximately 250 ml deionized water) was added and the solution was stirred for 18 hours. Stirring was stopped and water and solvent layers were allowed to separate. The water layer was removed and 1 liter of distilled water was added. The solution was stirred for 20 minutes. The water layer was permitted to separate and was removed. The wash with 1 liter of distilled water was performed a total of 3 times. Polymer was then precipitated by addition into methanol. The solid polymer was recovered by filtration and dried overnight at 60° C. in a vacuum oven. 222 g of dry polymer (94% conversion) was recovered after drying. Polymer molecular weight by GPC Mw=114,000 Mn=47,000, polydispersity (PDI)=2.42. Polymer Tg by DMA=180° C. Polymer composition by $^1$H NMR 48 mole % decyl Norbornene:52 mole % epoxy Norbornene.

Example 2

Polymer Synthesis

This example illustrates the synthesis of a 70/30 copolymer polymerized from decyl norbornene/glycidyl methyl ether norbornene). All glassware was dried at 60° C. under a 0.1 torr vacuum for 18 hours. The glassware was then transferred into a glovebox and the reaction vessel was assembled inside the glovebox. Ethyl acetate (917 g), cyclohexane (917 g), decyl norbornene (192 g, 0.82 mol) and glycidyl methyl ether norbornene (62 g, 0.35 mol) were added to the reaction vessel. The reaction vessel was removed from the glove box and connected to a dry nitrogen line. The reaction medium was degassed by passing a stream of nitrogen gas through the solution for 30 minutes. Inside the glovebox, 9.36 g (19.5 mmol) of a nickel catalyst, i.e., bis(toluene)bis(perfluorophenyl) nickel, was dissolved in 15 ml of toluene, taken up in a 25 mL syringe, removed from the glovebox and injected into the reactor. The reaction was stirred at 20° C. for 5 hours. At this time peracetic acid (50 molar equivalents based on the nickel catalyst—975 mmol) solution (glacial acetic acid diluted with approximately 750 ml deionized water and 33 g of 30 wt. % hydrogen peroxide diluted with approximately 250 ml deionized water) was added and the solution was stirred for 18 hours. Stirring was stopped and water and solvent layers were allowed to separate. The water layer was removed and 1 liter of distilled water was added. The solution was stirred for 20 minutes. The water layer was permitted to separate and was removed. The wash with 1 liter of distilled water was performed a total of 3 times. The polymer was then precipitated by addition into methanol. The solid polymer was recovered by filtration and dried overnight at 60° C. in a vacuum oven. 243 g of dry polymer (96% conversion) was recovered after drying. Polymer molecular weight by GPC Mw=115,366 Mn=47,424, polydispersity (PDI)=2.43. Polymer composition by $^1$H NMR: 70 mole % decyl norbornene; 30 mole % glycidyl methyl ether norbornene.

Example 3

Polymer Synthesis

A 40/60 copolymer prepared from decyl norbornene/glycidyl methyl ether norbornene was synthesized in the following manner. All glassware was dried at 160° C. for 18 hours. The dry glassware was transferred into a glove box and the reaction vessel was assembled inside the glove box. Toluene (670 g), decyl norbornene (29.43 g, 0.144 mol), glycidyl methyl ether norbornene (16.6 g, 0.212 mol) were added to the 1 L reaction vessel. The reaction vessel was removed from the glove box and connected to a dry nitrogen line. The reaction solution was degassed by passing a stream of nitrogen gas through the solution for 30 minutes. Inside the glove box, 1.59 g (3.63 mmol) of bis(toluene)bis(perfluorophenyl) nickel catalyst was dissolved in 7 ml of toluene, taken up in a 10 mL syringe, removed from the glove box and injected into the reactor. The reaction was stirred at 20° C. for 1 hour. At this time 180 g of Amberlite® IRC-718 ion exchange resin was added to the reaction vessel and the reaction was stirred for 5 hours at ambient temperature. The solution was filtered to remove the resin and the polymer was then precipitated by addition into 3 L of methyl alcohol. The solid polymer was recovered by filtration and dried overnight at 60° C. in a vacuum oven. 74.0 g of dry polymer (92.5% conversion) was recovered after drying. Mw=164,941 Mn=59,454, PDI=2.77, Polymer composition by $^1$H NMR: 41 mole % decyl norbornene, 59 mole % glycidyl methyl ether norbornene.

Example 4

Polymer Synthesis

The synthesis of a copolymer polymerized from decyl norbornene/glycidyl ether norbornene (70/30) having varying molecular weights is illustrated. The synthesis was performed under an inert atmosphere of nitrogen gas. Glassware was washed with Alconox® detergent and rinsed three times with distilled water. All glassware was dried at 120° C. overnight in a forced air oven. Solvents and monomers were degassed before use by passing a stream of dry nitrogen through the liquid for at least one hour. Solutions of catalyst and cocatalyst were prepared in a dry box. The catalyst was prepared by dissolving 0.00189 g (allyl)palladium(tricyclohexylphosphine)trifluoroacetate (756 g/mol) in 0.4 mL of methylene chloride resulting in 0.00625 Molar solution. The cocatalyst was prepared by dissolving 0.011 g lithium tetrakis (pentafluorophenyl)borate (875 g/mol) into 25 g of toluene resulting in a 457×10$^{-9}$ mol/mL solution. The reagent 1-hexene was added as a chain transfer agent for purposes of controlling molecular weight, in the portions indicated in the table below. To a dry crimp cap vial, solvents, monomers, catalysts, and cocatalyst were added in the following order:

TABLE I

| Reagent | Mass (g) | MW (g/mol) | Molar Mass (mol) |
|---|---|---|---|
| 1. Toluene | 50 | | |
| 2. Monomers | | | |
| AGE-NB | 2.05 g | 234 | 8.75 mmol |
| Decyl-NB | 0.68 g | 162 | 3.75 mmol |
| 3. 1-hexene | 0.42-0.84 g | 84.16 | 40-80 mol % |
| 4. LiFABA | 0.0109 g | 875 g/mol | 0.0125 mmol |
| 5. Pd catalyst | 0.00189 g | 756 g/mol | 0.0025 mmol |

GE-NB = glycidyl methyl ether norbornene
Decyl-NB = decyl norbornene
LiFABA = lithium tetrakis(pentafluorophenyl)borate
Pd Catalyst = (allyl)palladium(tricyclohexylphosphine)trifluoroacetate Each component was added with constant stirring. The sample vial was crimp capped under nitrogen, and placed in a fumehood where it was immersed in a silicon oil bath at 30° C. to stir for 4.5 hours. The samples were then opened, and precipitated by adding the viscous solution in a dropwise manner, to methanol. The resulting solid is filtered through a size M glass frit funnel. To ensure the elimination of all traces of residual monomer, the precipitated polymer was dissolved in toluene, and precipitated into methanol. The precipitated polymer was recovered by filtration and dried under vacuum for 18 hours at 70° C. and weighed.

| Reaction | Mol % 1-Hexene | % Conversion | Molecular weight (Mw/Mn) | PDI |
|---|---|---|---|---|
| 1 | 40 | 85 | 192/71 | 2.70 |
| 2 | 60 | 89 | 93/36 | 2.58 |
| 3 | 80 | 59 | 56/28 | 2.00 |

Example 5

Polymer Synthesis

A 50/50 copolymer polymerized from hexyl norbornene and 5-norbornene carboxylic acid-2-methyl-2,3-epoxypropylester was prepared according to the following procedure. A 25 mL Wheaton serum bottle and a magnetic stir bar were placed in an oven to dry at 160° C. for 18 hours. The dry bottle was transferred into a nitrogen atmosphere glove box. The vial was charged with hexyl norbornene (1.78 g, 0.01 mol) and 5-norbornene carboxylic acid-2-methyl-2,3-epoxypropyl ester (2.08 g, 0.01 mol) and 12.0 g of toluene. The bottle was sealed with a Teflon® lined crimp cap and the bottle was removed to a fumehood. The reaction medium was degassed by bubbling dry nitrogen gas through the solution for 10 minutes. Inside the glove box, (0.0973 g, 0.20 mmol) of bis(toluene)bis(perfluorophenyl) nickel catalyst was dissolved in 3.3 mL of toluene, taken up in a 10 mL syringe, removed from the glove box and injected into the reaction vial. The reaction mixture was stirred at ambient temperature for 48 hours. To the reaction bottle was added 0.56 g of Amberlite® IRC-718 ion-exchange resin available from the Rohm and Haas Company and the solution was mixed for a further 5 hours. The resin was removed by filtration. The polymer was precipitated into 100 mL of methanol and recovered by filtration. The precipitated polymer was washed with 25 mL of methanol and the dried in a vacuum oven at 60° C. for 18 hours. 1.80 g (47% yield) of dry polymer was recovered.

Example 6

Polymer Synthesis

A 65/25/10copolymer prepared from decyl norbornene/ glycidyl methyl ether norbornene/t-butyl ester norbornene was synthesized in the following manner. All glassware was dried at 160° C. for 18 hours. The dry glassware was transferred into a glove box and the reaction vessel was assembled inside the glove box. Toluene (750 g), decyl norbornene (56.2 g, 0.24 mol), glycidyl methyl ether norbornene (16.6, 0.091 mol) and t-butyl ester norbornene (7.17 g, 0.088 mol) were added to the 1 L reaction vessel. The reaction vessel was removed from the glove box and connected to a dry nitrogen line. The reaction solution was degassed by passing a stream of nitrogen gas through the solution for 30 minutes. Inside the glove box, 1.80 g (4.1 mmol) of bis(toluene)bis(perfluorophenyl) nickel catalyst was dissolved in 8 ml of toluene, taken up in a 10 mL syringe, removed from the glove box and injected into the reactor. The reaction was stirred at 20° C. for 1 hour. At this time 180 g of Amberlite® IRC-718 ion-exchange resin was added to the reaction vessel and the reaction was stirred for 5 hours at ambient temperature. The solution was filtered to remove the resin and the polymer was then precipitated by addition into 3 L of methanol. The solid polymer was recovered by filtration and dried overnight at 60° C.

in a vacuum oven. 74.0 g of dry polymer (92.5% conversion) was recovered after drying. Mw=122,208 Mn=50,743, PDI=2.41.

Example 7

Polymer Synthesis

A 65/25/10copolymer prepared from hexyl norbornene/ glycidyl methyl ether norbornene/t-butyl ester norbornene was synthesized in the following manner. All glassware was dried at 160° C. for 18 hours. The dry glassware was transferred into a glove box and the reaction vessel was assembled inside the glove box. Toluene (750 g), hexyl norbornene (51.39 g, 0.288 mol), glycidyl methyl ether norbornene (19.98 g, 0.11 mol) and t-butyl ester norbornene (8.62 g, 0.044 mol) were added to the 1 L reaction vessel. The reaction vessel was removed from the glove box and connected to a dry nitrogen line. The reaction solution was degassed by passing a stream of nitrogen gas through the solution for 30 minutes. Inside the glove box, 2.16 g (4.9 mmol) of bis(toluene)bis (perfluorophenyl) nickel catalyst was dissolved in 8 ml of toluene, taken up in a 10 mL syringe, removed from the glove box and injected into the reactor. The reaction was stirred at 20° C. for 1 hour. At this time 180 g of Amberlite® IRC-718 ion-exchange resin was added to the reaction vessel and the reaction was stirred for 5 hours at ambient temperature. The solution was filtered to remove the resin and the polymer was then precipitated by addition into 3 L of MeOH. The solid polymer was recovered by filtration and dried overnight at 60° C. in a vacuum oven. 69.8 g of dry polymer (87.2% conversion) was recovered after drying. Mw=127,866 Mn=51,433, PDI=2.48.

Example 8

Polymer Synthesis

This example illustrates the preparation of a 40/55/5 copolymer polymerized from decylnorbornene/glycidyl methyl ether norbornene/triethoxysilyl norbornene. All glassware was dried at 160° C. for 18 hours. The dry glassware was transferred into a glove box and the reaction vessel was assembled inside the glove box. Ethyl acetate (280 g), cyclohexane (280 g), decyl norbornene (34.7 g, 0.16 mol), glycidyl methyl ether norbornene (39.6 g, 0.22 mol) and triethoxysilylnorbornene (2.56 g, 0.01 mol) were added to the reaction vessel. The reaction vessel was removed from the glove box and connected to a dry nitrogen line. The reaction solution was degassed by passing a stream of nitrogen gas through the solution for 30 minutes. Inside the glove box, 1.92 g (4.0 mmol) of bis(toluene)bis(perfluorophenyl) nickel catalyst was dissolved in 15 ml of toluene, taken up in a 25 mL syringe, removed from the glove box and injected into the reactor. The reaction was stirred at 20° C. for 5 hours. At this time 1.93 g 8-hydroxyquinoline (8-HQ) was added to the reaction vessel and the reaction was stirred for 18 hours at ambient temperature. The solution was washed with methanol (5×200 mL) to remove the 8-HQ/Ni chelate. 50 g of Amberlite® IRC-718 ion exchange resin was added to the reaction vessel and the solution was stirred overnight at ambient temperature. The resin beads were removed by filtration and the polymer was then precipitated by addition into methanol. A solid polymer was recovered by filtration and dried overnight at 60° C. in a vacuum oven. 55.0 g of dry polymer (76% conversion) was recovered after drying. The polymer was found to have Mw=174,000 and Mn=60,000 daltons. The polydispersity index was 2.9.

Example 9

Preparation of Photodefinable Composition

A polymer solution was prepared using the 256.5 g of the polymer obtained in Example 2. The polymer was placed into a 1-liter wide mouth glass bottle and 313.5 g of electronic grade mesitylene was added. The bottle was sealed with a Teflon® lined polyethylene cap and the polymer was uniformly dispersed by rolling the bottle at 50 rpm for 18 hours. The polymer solution was filtered through a 0.45 micron Teflon® filter to remove any particulate matter. This operation was performed under a laminar flow hood in a class 1000 clean room. The filtered polymer solution was collected in a class 1000 clean room bottle. The final concentration of the polymer in solution was determined by gravimetric analysis to be 45.0 wt. %. 20.0 g of polymer solution was weighed into a 50-mL amber clean room bottle. All additives were weighed out separately into 10-mL beakers and then dissolved in 5.0 g of anisole. The additive package included Rhodorsil® PI 2074 (4-methylphenyl-4-(1 methylethyl)phenyliodonium tetrakis(pentafluorophenyl)borate) available from Rhodia. (0.2757 g, $2.71 \times 10^{-4}$ mol), SpeedCure® CPTX 1-chloro-4-propoxy-9H-thioxanthone available from Lambson Group Inc. (0.826 g, 0.271 mmol), phenothiazine (Aldrich Chemical Company) (0.054 g, 0.271 mmol), and Irganox® 1076 antioxidant (3,5-di-tert-butyl-4-hydroxyhydrocinnamate) from Ciba Fine Chemicals. (0.1378 g, $2.60 \times 10^4$ mol). The materials were dissolved into 5.0 g of anisole and the solution was filtered through a 0.22 micron syringe filter as it was added to the polymer solution. The solution was rolled at 50 rpm for 18 hours to disperse the additives in the polymer solution.

Example 10

Preparation of Photodefinable Composition 256.5 g of the polymer obtained in Example 2 was used to prepare a 45 weight % polymer solution in mesitylene a described in Example 9. 20.0 g of the polymer solution (45.0 wt. % solids) was weighed into a 50-mL amber clean room bottle. Formulation additives were weighed out separately into 10-mL beakers and then dissolved in 5.0 g of anisole. The additives were Rhodorsil® PI 2074 (4-methylphenyl-4-(l methylethyl) phenyliodonium tetrakis(pentafluorophenyl) borate) (0.184 g, 0.181 mmol), Isopropyl-9H-thioxanthen-9-one (First Cure ITX Albemarle 0.046 g, 0.181 mmol), phenothiazine (Aldrich Chemical Co. 0.036 g, 0.181 mmol) and Irganox® 1076 antioxidant (CIBA Fine Chemicals) (0.1378 g, $2.60 \times 10^{-4}$ mol). The materials were dissolved into 5.0 g of anisole and the solution was filtered through a 0.22-micron syringe filter as it was added to the polymer solution. The solution was rolled at 50 rpm for 18 hours to disperse the additives in the polymer solution.

Example 11

Preparation of Photodefinable Composition

A polymer solution was prepared using the 228.0 g of the polymer obtained in Example 2. The polymer was placed into a 1-liter wide mouth glass bottle and 342.0 g of decahydronaphthalene was added. The bottle was sealed with a Teflon® lined polyethylene cap and the polymer was uniformly dispersed by rolling the bottle at 50 rpm for 18 hours. The polymer solution was filtered through a 0.45 micron Teflon® filter to remove any particulate matter. This operation was performed under a laminar flow hood in a class 1000 clean room. The filtered polymer solution was collected in a clean (0 particles greater than 0.5 microns—Eagle Pitcher Co.) glass bottle. The final concentration of the polymer in solution was determined by gravimetric analysis to be 40.0 wt. %. 20.0 g of polymer solution was weighed into a 50-mL amber clean room bottle. Al additives were weighed out separately into 10-mL beakers and then dissolved in 5.0 g of anisole. The additive package included Rhodorsil® PI 2074 (4-methylphenyl-4-(1 methylethyl)phenyliodonium tetrakis (pentafluorophenyl)borate) available from Rhodia. (0.2757 g, $2.71 \times 10^{-4}$ mol), Isopropyl-9H-thioxanthen-9-one (FirstCure ITX Albemarle 0.046 g, 0.181 mmol), phenothiazine (Aldrich Chemical Company) (0.054 g, 0.271 mmol), and Irganox® 1076 antioxidant (3,5-di-tert-butyl-4-hydroxyhydrocinnamate) from Ciba Fine Chemicals (0.1378 g, $2.60 \times 10^{-4}$ mol). The materials were dissolved into 5.0 g of anisole and the solution was filtered through a 0.22 micron syringe filter as it was added to the polymer solution. The solution was rolled at 50 rpm for 72 hours to disperse the additives in the polymer solution.

Example 12

Preparation of Photodefinable Composition

A polymer solution was prepared as set forth in Example 9. 20.0 g of the polymer solution containing the polymer synthesized in Example 1 (45.0 wt. % solids) was weighed into a 50-mL amber clean room bottle. Formulation additives were weighed out separately into 10-mL beakers and then dissolved in 5.0 g of anisole. The additives were Rhodorsil® PI 2074 (4-methylphenyl-4-(1 methylethyl)phenyliodonium tetrakis(pentafluorophenyl)borate) (0.184 g, 0.181 mmol), Isopropyl-9H-thioxanthen-9-one (FirstCure ITX 0.046 g, 0.181 mmol), phenothiazine (Aldrich Chemical Co. 0.036 g, 0.181 mmol) and Irganox® 1076 antioxidant (CIBA Fine Chemicals) (0.1378 g, $2.60 \times 10^{-4}$ mol). The materials were dissolved into 5.0 g of anisole and the solution was filtered through a 0.22-micron syringe filter as it was added to the polymer solution. The solution was rolled at 50 rpm for 18 hours to disperse the additives in the polymer solution.

Example 13

Preparation of Photodefinable Composition

A polymer solution was prepared as set forth in Example 11. 20.0 g of the polymer solution containing the polymer synthesized in Example 2 (40.0 wt. % solids) was weighed into a 50-mL amber clean room bottle. Formulation additives were weighed out separately into 10-mL beakers and then dissolved in 5.0 g of anisole. The additives were Rhodorsil® PI 2074 (4-methylphenyl-4-(1 methylethyl)phenyliodonium tetrakis(pentafluorophenyl)borate) (0.184 g, 0.181 mmol), Isopropyl-9H-thioxanthen-9-one (FirstCure ITX 0.046 g, 0.181 mmol), phenothiazine (Aldrich Chemical Co. 0.036 g, 0.181 mmol), Irganox® 1076 antioxidant (CIBA Fine Chemicals) (0.1378 g, 0.26 mmol) and 3-glycidoxypropyl trimethoxysilane (Sigma-Aldrich) (0.4595 g, 1.94 mmol). The materials were dissolved into 5.0 g of anisole and the solution was filtered through a 0.22-micron syringe filter as it was added to the polymer solution. The solution was rolled at 50 rpm for 18 hours to disperse the additives in the polymer solution.

Example 14

Preparation of Photodefinable Composition

A polymer solution was prepared as set forth in Example 9. 20.0 g of the polymer solution containing the polymer synthesized in Example 1 (45.0 wt. % solids) was weighed into a 50 mL amber clean room bottle. Formulation additives were weighed out separately into 10 mL beakers and then dissolved in 5.0 g of anisole. The additives were DTBPI-TF di(4-tert-butylphenyl)Iodonium triflate (PAG) (0.2757 g, $5.08 \times 10^{-4}$ mol) (Toyo Gosei Kogyo Tokyo), 9-methoxyanthracene (sensitizer) (0.1378 g, $6.62 \times 10^{-4}$ mol), and Irganox® 1076 antioxidant (0.1378 g, $2.60 \times 10^4$ mol) (CIBA Fine Chemicals). The materials were dissolved into 5.0 g of mesitylene and the solution was filtered through a 0.22 micron syringe filter as it was added to the polymer solution. The solution was rolled at 50 rpm for 18 hours to disperse the additives in the polymer solution.

Example 15

Formulation of Polymer Composition

A polymer solution was prepared as set forth in Example 9. 72.81 g of the polymer solution containing the polymer synthesized in Example 2 (45.0 weight % solution) was weighed into a 100 mL amber clean room bottle. Formulation additives were weighed out separately into 10-mL beakers and then dissolved in 5.0 g of anisole. The additives were Rhodorsil® PI 2074 (4-methylphenyl-4-(1 methylethyl)phenyliodonium tetrakis(pentafluorophenyl)borate) (1.6251 g, 1.587 mmol), 1-chloro-4-propoxy-9H-thioxanthone (SpeedCure CPTX 0.4837 g, 1.587 mmol), and Irganox® 1076 antioxidant (CIBA Fine Chemicals) (0.1378 g, $2.60 \times 10^{-4}$ mol). The materials were dissolved into 5.0 g of anisole and the solution was filtered through a 0.22-micron syringe filter as it was added to the polymer solution. To this solution was added the reactive solvent 1,4-cyclohexanedimethanol divinyl ether (3.205 g, 0.166 mol). The solution was rolled at 50 rpm for 18 hours to disperse the additives in the polymer solution.

Example 16

Imaging of Photodefinable Composition

A 2.5 g aliquot of the composition described in Example 9 was taken up in an Eppendorf pipette and applied to a 4 inch Silicon wafer. The silicon wafer was spun using a CEE 1000CB Wafer Spin Station at 500 rpm for 10 seconds followed by spinning at 1000 rpm for 60 seconds. The wafer was placed on a hot plate heated at 100° C. for 10 minutes to flash off the residual solvent. The wafer was imagewise exposed to 500 mJ/cm² at 365 nm radiation through a patterned chrome plated glass mask on an AB M Mask Aligner. The wafer was heated at 100° C. for 20 minutes in a Despatch LND nitrogen oven to advance the crosslinking reaction in the exposed regions of the polymer film. The pattern was developed by puddling the wafer under 20 mL of a limonene based solvent for 60 seconds, spinning the wafer at 3000 rpm for 60 seconds to remove the solvent puddle and then spraying the wafer with isopropyl alcohol for 10 seconds to fix the pattern. The wafer was then placed in a Despatch LND nitrogen oven and baked at 200° C. in order to complete the crosslinking reaction.

Example 17

Imaging of Photodefinable Composition

A 2.5 g aliquot of the composition described in Example 11 was taken up in an Eppendorf pipette and applied to a 4 inch Silicon wafer. The silicon wafer was spun using a CEE 1000CB Wafer Spin Station at 500 rpm for 10 seconds followed by spinning at 1000 rpm for 40 seconds. The wafer was placed on a hot plate heated at 120° C. for 5 minutes to flash off the residual solvent. The wafer was image-wise exposed to 500 mJ/cm$^2$ of 365 nm radiation through a patterned chrome plated glass mask on an AB M Mask Aligner. The wafer was heated at 115° C. for 15 minutes in a Despatch LND nitrogen oven to advance the crosslinking reaction in the exposed regions of the polymer film. The pattern was developed by puddling the wafer under 20 mL of a limonene based solvent for 60 seconds, spinning the wafer at 3000 rpm for 60 seconds to remove the solvent puddle and then spraying the wafer with isopropyl alcohol for 10 seconds to fix the pattern. The wafer was then placed in a Despatch LND nitrogen oven and baked at 160° C. for 60 minutes in order to complete the crosslinking reaction.

Example 18

Imaging of Photodefinable Composition

A 2.5 g aliquot of the composition described in Example 14 was taken up in an Eppendorf pipette and applied to a 4 inch Silicon wafer. The silicon wafer was spun using a CEE 1000CB Wafer Spin Station at 500 rpm for 10 seconds followed by spinning at 1000 rpm for 60 seconds. The wafer was placed on a hot plate heated at 100° C. for 10 minutes to flash off the residual solvent. The wafer was imagewise exposed to 500 mmJ/cm$^2$ at 365 nm radiation through a patterned chrome plated glass mask on an AB M Mask Aligner. The wafer was heated at 100° C. for 20 minutes in a Despatch LND nitrogen oven to advance the crosslinking reaction in the exposed regions of the polymer film. The pattern was developed by puddling the wafer under 20 mL of a limonene based solvent for 60 seconds, spinning the wafer at 3000 rpm for 60 seconds to remove the solvent puddle and then spraying the wafer with isopropyl alcohol for 10 seconds to fix the pattern. The wafer was then placed in a Despatch LND nitrogen oven and baked at 200° C. in order to complete the crosslinking reaction.

Example 19

Imaging of Photodefinable Composition

A silicon oxynitride coated 4 inch silicon wafer was plasma treated in a March CS-1701 Reactive Ion Etch unit using a 50/50 Argon/oxygen gas mixture at 300 mTorr pressure and 300 W power for 30 seconds. The cleaned wafer was placed on the chuck of a CEE 1000CB Wafer Spin Station and covered with a 10 mL aliquot of a solution of an adhesion promoter (3-aminopropyl triethoxysilane) (5 weight % in ethanol/deionized water 95/5). The wafer was kept static (0 rpm) for 60 seconds and the spun at 3500 rpm for 60 seconds to remove the excess solution. The wafer was baked on a hot plate at 130° C. for 30 minutes, removed from the hot plate, rinsed with ethanol for 15 seconds and then dried at 100° C. for 10 minutes. A 2.5 g aliquot of the resist composition described in Example 9 was taken up in an Eppendorf pipette and applied to a 4 inch Silicon wafer. The silicon wafer was spun using a CEE 1000CB Wafer Spin Station at 500 rpm for 10 seconds followed by spinning at 1000 rpm for 60 seconds. The wafer was placed on a hot plate heated at 100° C. for 10 minutes to flash off the residual solvent. The wafer was imagewise exposed to 500 mJ/cm$^2$ at 365 nm radiation through a patterned chrome plated glass mask on an AB M Mask Aligner. The wafer was heated at 100° C. for 20 minutes in a Despatch LND nitrogen oven to advance the crosslinking reaction in the exposed regions of the polymer film. The pattern was developed by puddling the wafer under 20 mL of a limonene based solvent for 60 seconds, spinning the wafer at 3000 rpm for 60 seconds to remove the solvent puddle and then spraying the wafer with isopropyl alcohol for 10 seconds to fix the pattern. The wafer was then placed in a Despatch LND nitrogen oven and baked at 200° C. in order to complete the crosslinking reaction.

Example 20

Imaging of Photodefinable Composition

A 2.5 g aliquot of the composition described in Example 13 was taken up in an Eppendorf pipette and applied to a 4 inch Silicon wafer. The silicon wafer was spun using a CEE 1000CB Wafer Spin Station at 500 rpm for 10 seconds followed by spinning at 1000 rpm for 40 seconds. The wafer was placed on a hot plate heated at 120° C. for 5 minutes to flash off the residual solvent. The wafer was image-wise exposed to 500 mJ/cm$^2$ of 365 nm radiation through a patterned chrome plated glass mask on an AB M Mask Aligner. The wafer was heated at 115° C. for 15 minutes in a Despatch LND nitrogen oven to advance the crosslinking reaction in the exposed regions of the polymer film. The pattern was developed by puddling the wafer under 20 mL of a limonene based solvent for 60 seconds, spinning the wafer at 3000 rpm for 60 seconds to remove the solvent puddle and then spraying the wafer with isopropyl alcohol for 10 seconds to fix the pattern. The wafer was then placed in a Despatch LND nitrogen oven and baked at 160° C. for 60 minutes in order to complete the crosslinking reaction.

Example 21

Spray Developing

In this example, a resist composition is formulated and imaged using the same procedures, ingredients and amounts as set forth in Example 19. The pattern is developed by spraying the wafer with the limonene based developer for 60 seconds and then with isopropyl alcohol for 10 seconds. The sample is cured at 200° C. as set forth above.

Example 22

This example demonstrates that the polymers contained in the compositions of the present invention can be cured at a temperature below the Tg of the polymer. A composition was formulated, imaged and developed as set forth in Example 19. The final cure was carried out in a Despatch LND nitrogen oven at 160° C. for 1 hour. The polymer contained in the formulation had a Tg of 180° C. as measured by DMA. The polymer exhibited a Tg of approximately 255° C. after the final cure.

Example 23

A resist composition was formulated, imaged and developed as set forth in Example 15. The entire polymer film was then exposed to 500 mJ/cm$^2$ of 365 nm UV radiation in a non-imagewise manner to induce the additional crosslinking of any unreacted epoxy groups. A final cure was carried out in a Despatch LND nitrogen oven at 120° C. for 2 hours. After curing the polymer exhibited a Tg of approximately 257° C.

Example 24

Imaging of Photodefinable Composition

In this example, a composition was formulated as set forth in Example 15. The photodefinable polymer composition was imaged and developed using the same procedures as set forth in Example 19. The pattern was developed by spraying the wafer with the limonene based developer for 60 seconds and then with isopropyl alcohol for 10 seconds. The imaged and developed polymer sample was then exposed to 500 mJ/cm2 of 365 nm UV radiation. The sample was cured at 120° C. for 1 hour in a Despatch LND nitrogen oven.

Example 25

In this example, the composition set forth in Example 9 was applied to a silicon wafer as follows. The wafer is placed on a flat, leveled table and fixed in place with masking tape. A doctor blade with a nominal gap of 12 mils (300 microns) was placed adjacent to the wafer. 15 mL of the solution was applied to one edge of the wafer. The doctor blade is drawn across the wafer to uniformly spread the solution across the wafer surface. The wafers were placed in a nitrogen oven set at 90° C. and allowed to dry for 45 minutes. The wafers were then exposed imagewise to 500 mJ/cm$^2$ of 365 nm UV radiation through a chrome plated glass mask. The wafers were returned to the nitrogen oven and baked at 90° C. for 20 minutes to advance the crosslinking reaction. The pattern was developed by spraying the wafer for 90 seconds with a limonene-based developer solvent. The film was rinsed with isopropyl alcohol for 15 seconds to fix the image. A grid pattern of 300 micron diameter circular vias was opened in the film.

Example 26

Imaging of Photodefinable Composition

In this example, a composition formulated as set forth in Example 9, was applied to two silicon oxynitride coated silicon wafers and exposed imagewise to 500 mJ/cm$^2$ of 365 nm radiation in the manner described in Example 16. The exposed wafers were then processed as follows:

| Wafer No. | Bake Temperature | Bake Time |
|---|---|---|
| 1 | 90° C. | 20 minutes |
| 2 | 120° C. | 15 minutes |

The pattern was then developed by spraying the wafer with a limonene based developer for 60 seconds and then rinsing with isopropyl alcohol for 10 seconds to fix the pattern. The Wafers were then baked in a nitrogen oven for 1 hour at 160° C. to complete the crosslinking reaction. A pattern of 300 micron diameter circular vias was developed in the dielectric film. The wafers were broken so that Scanning Electron Microscopy could be performed. Through SEM imaging, the slope angles of the sidewalls of the 300 micron vias were measured and recorded as follows:

| Wafer # | Side wall slope angle |
|---|---|
| 1 | 78.4° |
| 2 | 60.8° |

In the application of polymer compositions as dielectric layers it is necessary to open vias to permit the routing of electrical connections between the active IC chip and the substrate to which the IC is attached. Optimum reliability performance of these interconnects is achieved when the via openings possess sloped side walls which result in lower mechanical stresses accumulating in the metal wiring that passes through the vias. In existing compositions, such sloped sidewalls are the product of shrinkage, on the order of 40-50%, of the resist composition during the final cure stage. It is a unique characteristic of this resist composition that sloped via sidewalls can be obtained even though minimal shrinkage, 10%, is observed during the final cure.

Example 27

Imaging of Photodefinable Composition 5 g of the polymer obtained in Example 4 is dissolved in 5 g of electronic grade mesitylene. The solution is rolled for 18 hours to dissolve the polymer. The polymer solution is filtered through a 0.45-micron filter to remove any particulates. To the solution is added 0.15 g (0.148 mmol) of Rhodorsil® 2074 photoinitiator and 0.75 g (2.4 mmol) of Speedcure® CTPX (Lambson Group Ltd.). The solution is rolled for 18 hours to completely disperse the photoactive compounds. A inch silicon oxynitride wafer is spin coated with 2.5 g of the polymer solution. The resulting coating is soft baked by heating at 100° C. on a hot plate for 10 minutes. The film is patterned by exposing it imagewise to 500 mJ/cm$^2$ of 365 nm (I line) radiation through a chrome plated glass mask. The resulting pattern in the polymer film is enhanced by heating the wafer in a nitrogen oven at 100° C. for 20 minutes. The pattern is developed by spraying the film with limonene for 60 seconds to dissolve the unexposed regions of the film. The wet film is then rinsed with isopropyl alcohol for 15 seconds. The film is cured for 60 minutes at 200° C. under a nitrogen atmosphere.

Example 28

Imaging of Photodefinable Composition

In this example, a composition is formulated, imaged and developed using the same procedures, ingredients and amounts as set forth in Example 26, except that the polymer synthesized in Example 4 is employed as the photodefinable material.

Example 29

Imaging of Photodefinable Composition

In this example, a composition was formulated, imaged and developed using the same procedures, ingredients and amounts as set forth in Example 27, except that the polymer synthesized in Example 7 was employed as the photodefinable material.

Example 30

Imaging of Photodefinable Composition

Imaging of a polymer film formulated and cast from the polymer obtained in Example 9 was performed on a 4 inch diameter silicon oxynitride wafer. The wafer was subjected to successive rinses (30 seconds each) with chloroform, methanol, deionized water, and isopropyl alcohol. Each of the solvent rinses was delivered from a polyethylene wash bottle.

Example 31

Imaging of Photodefinable Composition

The polymer (25 g) obtained in Example 9 was dissolved in 30.5 g of mesitylene (Aldrich Chemical Co.) to achieve a 45% solids concentration based on the total weight of the polymer and solvent. 0.50 g (0.92 mmol) of DtBPI-TF di(tertbutylphenyl)iodonium triflate PAG (Toyo Gosei Co. Ltd.) and 0.25 g (1.2 mmol) of 9-methoxyanthracene where weighed out and dissolved in 5 mL of mesitylene. The solution resulting solution was filtered thorough a 0.22 micron syringe filter before addition to the polymer solution. The solution containing the photoactive compounds was rolled for 18 hours to completely disperse the constituents.

The polymer solution was applied to the cleaned wafer by dispensing 2.5 grams of the solution onto the wafer surface. The wafer was then spun at 500 rpm for ten seconds, followed by an addition spin cycle at 1000 rpm for 60 seconds. The wafer was soft baked on a hot plate at 100° C. for 10 minutes to remove residual solvent. The cast polymer film was exposed imagewise to 500 mJ/cm² of 365-nm radiation through a chrome metal plated glass mask. The cure was advanced by thermally baking the wafer in a convection oven at 100° C. for 20 minutes under an atmosphere of nitrogen gas. The pattern was then developed puddling the wafer with a limonene based developer solvent for 60 seconds. The wafer was spun at 3000 rpm to throw off the solvent and partially dry the sample. The developed film was then rinsed with isopropyl alcohol and dried by heating on a hot plate at 100° C. for 60 seconds. With this procedure circular vias with a diameter of 300 microns were opened through the film. The resulting patterned film was then cured at 200° C. for 1 hour in a convection oven under an atmosphere of nitrogen in order to advance the cure of the epoxy crosslinking groups to completion.

Example 32

Imaging of Photodefinable Composition

A polymer solution containing 45% solids similar to the composition in Example 30 was formulated except that a 70/30 copolymer containing repeating units polymerized from decyl norbornene/glycidyl methyl ether norbornene was utilized. A solvent rinsed silicon oxynitride wafer was exposed to an oxygen/argon plasma (50/50) for sixty seconds in a March CS-1701 R.I.E. Plasma Etcher powered by a Seren R600 operating at 13.56 MHz. The etched wafer was then mounted on the spin chuck of a Brewer Science Model 100CB spinner. A solution of adhesion promoter (prepared by dissolving a 10 ml aliquot of 3-aminopropyl triethoxysilane in 200 ml of ethanol/deionized water (95/5) solution and aged for 1 hour at ambient temperature) was applied to the wafer by puddling 15 ml of the solution on the wafer surface and holding the wafer static for sixty seconds. The wafer was then spun at 3500 rpm for sixty seconds. During the first fifteen seconds of the spin cycle the wafer surface was rinsed with 50 ml of an ethanol/water (95/5) solution. The wafer was then dried on a hot plate at 100° C. for sixty seconds. The solution was applied to the treated wafer by dispensing 2 g of the solution onto the static wafer surface. The wafer was then spun at 500 rpm for ten seconds followed by an additional spin cycle at 1500 rpm for forty seconds. The wafer was transferred to a hot plate where it was soft baked at 100° C. for 20 minutes to remove residual solvent. The resulting polymer film was measured by profilometry and found to be 25 microns thick. The polymer film was patterned by exposing it to 500 mJ/cm² of 365 nm radiation through a metallized glass mask. The pattern was advanced by thermally baking the wafer in a convection oven at 100° C. for 20 minutes under an atmosphere of nitrogen gas. The film was sprayed with a limonene based developer solvent for 60 seconds to develop the pattern. The wet film was then rinsed with isopropyl alcohol and dried by heating on a hot plate for 60 seconds at 100° C. The developed pattern gave 50 to 300 µM via openings with a resolution down to an aspect ratio of 2:1 via diameter: film thickness. The patterned film was then cured at 200° C. for 1 hour in a convection oven under an atmosphere of nitrogen in order to advance the cure of the epoxy crosslinking groups to completion.

Example 33

Imaging of Photodefinable Composition

The same composition utilized in Example 32 was applied to applied to a silicon oxynitride wafer and imaged utilizing the same procedures set forth in Example 32 except that the wafer was treated with a different adhesion promoter. A 2-micron thick layer of a photosensitive polyimide (PI 2771 available from HD Microsystems) was applied to the wafer surface, patterned, developed and cured according to the processing guidelines for the polyimide material. The wafer was exposed to an oxygen/argon plasma (50/50 feed ratio) using a 96 sccm/second feed rate, for sixty seconds. The patterned, developed and cured coating contained 50 to 300 µM via openings with a resolution down to an aspect ratio of 2:1 via diameter: film thickness.

The present invention has been described with reference to specific details of particular embodiments thereof. It is not intended that such details be regarded as limitations upon the scope of the invention except insofar as and to the extent that they are included in the accompanying claims.

We claim:
1. A copolymer composition comprising:
a copolymer with two or more types of repeat units in accordance with structural formula I:

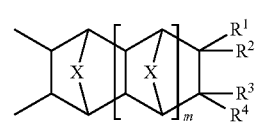

(I)

such types of repeat units being derived from monomers where X is selected from —$CH_2$—, —$CH_2$—$CH_2$— and O; m is an integer from 0 to 5; and each occurrence of $R^1$, $R^2$, $R^3$ and $R^4$ is independently selected from one of the following groups:

H, $C_1$ to $C_{25}$ linear, branched, and cyclic alkyl, aryl, aralkyl, alkaryl, alkenyl and alkynyl;

$C_1$ to $C_{25}$ linear, branched, and cyclic alkyl, aryl, aralkyl, alkaryl, alkenyl and alkynyl containing one or more hetero atoms selected from O, N, and Si;

an epoxy containing group in accordance with structural formula II:

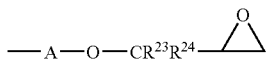
(II)

where A is a linking group selected from $C_1$ to $C_6$ linear, branched, and cyclic alkylene, and $R^{23}$ and $R^{24}$ are independently selected from H, methyl and ethyl;

an epoxy containing group in accordance with structural formula III:

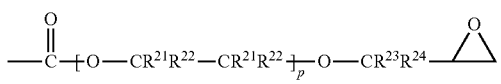
(III)

where p is an integer of from zero to 6, $R^{23}$ and $R^{24}$ are as defined above, and each occurrence of $R^{21}$ and $R^{22}$ are independently selected from H, methyl and ethyl; —$(CH_2)_nC(O)OR^5$, —$(CH_2)_nC(O)OR^6$, —$(CH_2)_nOR^6$, —$(CH_2)_nOC(O)R^6$, —$(CH_2)_nC(O)R^6$, and —$(CH_2)_nOC(O)OR^6$; and any combination of two of $R^1$, $R^2$, $R^3$, and $R^4$ linked together by a linking group selected from $C_1$ to $C_{25}$ linear, branched, and cyclic alkylene and alkylene aryl, wherein n is an integer of from 1 to 25, $R^5$ is an acid labile group and $R^6$ is selected from H, $C_1$ to $C_6$ linear, branched, and cyclic alkyl, an epoxy containing group of structural formula II as defined above; and where one of $R^1$, $R^2$, $R^3$, or $R^4$ of one type of repeat unit is a pendant epoxy containing group in accordance with formulae II or III, and the others of $R^1$, $R^2$, $R^3$, or $R^4$ are each H.

2. A copolymer composition comprising:

a copolymer having a glass transition temperature of from 170° C. to 350° C., and a weight average molecular weight (Mw) of from 70,000 to 250,000 as determined by gel permeation chromatography using poly(norbornene) standards, such copolymer having at least two distinct types of repeat units derived from monomers in accordance with structural formula I:

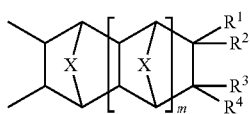
(I)

where X is selected from —$CH_2$—, —$CH_2$—$CH_2$— and O; m is an integer from 0 to 5; and each occurrence of $R^1$, $R^2$, $R^3$ and $R^4$ is independently selected from one of the following groups:

H, $C_1$ to $C_{25}$ linear, branched, and cyclic alkyl, aryl, aralkyl, alkaryl, alkenyl and alkynyl;

$C_1$ to $C_{25}$ linear, branched, and cyclic alkyl, aryl, aralkyl, alkaryl, alkenyl and alkynyl containing one or more hetero atoms selected from O, N, and Si;

an epoxy containing group of structural formula II:

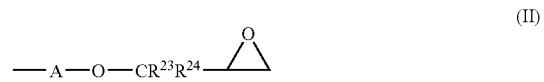
(II)

where A is a linking group selected from $C_1$ to $C_6$ linear, branched, and cyclic alkylene and $R^{23}$ and $R^{24}$ are independently selected from H, methyl and ethyl;

an epoxy containing group of structural formula III:

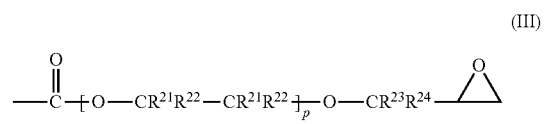
(III)

where p is an integer of from zero to 6, $R^{23}$ and $R^{24}$ are as defined above, and each occurrence of $R^{21}$ and $R^{22}$ are independently selected from H, methyl and ethyl; —$(CH_2)_nC(O)OR^5$, —$(CH_2)_nC(O)OR^6$, —$(CH_2)_nOR^6$, —$(CH_2)_nOC(O)R^6$, —$(CH_2)_nC(O)R^6$, and —$(CH_2)_nOC(O)OR^6$;

any combination of two of $R^1$, $R^2$, $R^3$, and $R^4$ linked together by a linking group selected from $C_1$ to $C_{25}$ linear, branched, and cyclic alkylene and alkylene aryl, wherein n is an integer of from 1 to 25, $R^5$ is an acid labile group and $R^6$ is selected from H, $C_1$ to $C_6$ linear, branched, and cyclic alkyl, an epoxy containing group of structural formula II as defined above; and one type of repeat unit selected from repeat units having structural units XI, XII, XIII, XIV and XV, where such one type of repeat unit represents up to 25 mole % of the copolymer's repeat units:

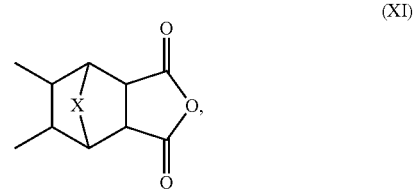
(XI)

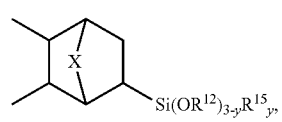
(XII)

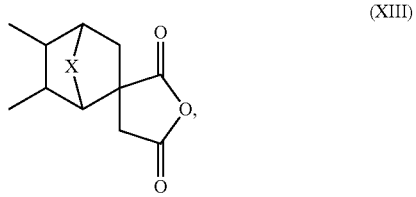
(XIII)

-continued

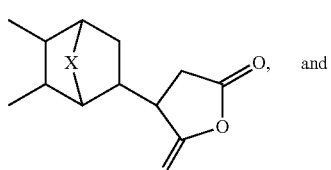

(XIV)

and

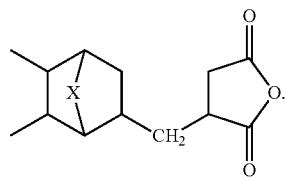

(XV)

where X is defined as above, y is 0, 1 or 2; $R^{12}$ is selected from $C_1$ to $C_6$ linear, branched, and cyclic alkyl; and $R^{15}$ is selected from H and $C_1$ to $C_4$ linear and branched alkyl; and another type of repeat unit having one of $R^1$, $R^2$, $R^3$, or $R^4$ being a pendant epoxy containing group in accordance with formulae II or III, and where the others of $R^1$, $R^2$, $R^3$, or $R^4$ are each H; and where such another type of repeat units represents from 20 mole % to 60 mole % of the copolymer's repeat units.

3. A copolymer composition comprising:
a copolymer having two or more types of repeat units derived from two or more types of norbornene-type monomers in accordance with the following structural formula:

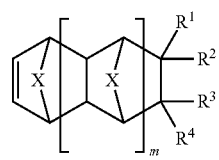

where X is selected from —$CH_2$—, —$CH_2$—$CH_2$— and O; m is an integer from 0 to 5; and each occurrence of $R^1$, $R^2$, $R^3$ and $R^4$ is independently selected from one of the following groups:

H, $C_1$ to $C_{25}$ linear, branched, and cyclic alkyl, aryl, aralkyl, alkaryl, alkenyl and alkynyl;

$C_1$ to $C_{25}$ linear, branched, and cyclic alkyl, aryl, aralkyl, alkaryl, alkenyl and alkynyl containing one or more hetero atoms selected from O, N, and Si;

an epoxy containing group in accordance with structural formula II:

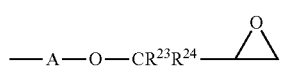

(II)

where A is a linking group selected from $C_1$ to $C_6$ linear, branched, and cyclic alkylene, and $R^{23}$ and $R^{24}$ are independently selected from H, methyl and ethyl;

an epoxy containing group in accordance with structural formula III:

(III)

$$—\overset{O}{\underset{\|}{C}}\!\!+\!\!O—CR^{21}R^{22}\!-\!CR^{21}R^{22}\!\!+_{\!p}\!O—CR^{23}R^{24}\!\!-\!\!\overset{O}{\triangle}$$

where p is an integer of from zero to 6, $R^{23}$ and $R^{24}$ are as defined above, and each occurrence of $R^{21}$ and $R^{22}$ are independently selected from H, methyl and ethyl; —$(CH_2)_nC(O)OR^5$, —$(CH_2)_nC(O)OR^6$, —$(CH_2)_nOR^6$, —$(CH_2)_nOC(O)R^6$, —$(CH_2)_nC(O)R^6$, and —$(CH_2)_nOC(O)OR^6$; and any combination of two of $R^1$, $R^2$, $R^3$, and $R^4$ linked together by a linking group selected from $C_1$ to $C_{25}$ linear, branched, and cyclic alkylene and alkylene aryl, wherein n is an integer of from 1 to 25, $R^5$ is an acid labile group and $R^6$ is selected from H, $C_1$ to $C_6$ linear, branched, and cyclic alkyl, an epoxy containing group of structural formula II as defined above; and where one of $R^1$, $R^2$, $R^3$, or $R^4$ of one type of repeat unit is a pendant epoxy containing group in accordance with formulae II or III, and the others of $R^1$, $R^2$, $R^3$, or $R^4$ are each H.

4. A copolymer composition comprising:
a copolymer having two or more types of repeat units derived from two or more types of norbornene-type monomers in accordance with the following structural formula:

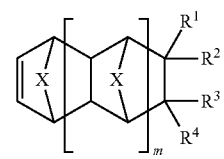

where X is selected from —$CH_2$—, —$CH_2$—$CH_2$— and O; m is an integer from 0 to 5; and each occurrence of $R^1$, $R^2$, $R^3$ and $R^4$ is independently selected from one of the following groups:

H, $C_1$ to $C_{25}$ linear, branched, and cyclic alkyl, aryl, aralkyl, alkaryl, alkenyl and alkynyl;

$C_1$ to $C_{25}$ linear, branched, and cyclic alkyl, aryl, aralkyl, alkaryl, alkenyl and alkynyl containing one or more hetero atoms selected from O, N, and Si;

an epoxy containing group of structural formula II:

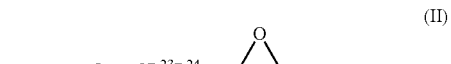

(II)

where A is a linking group selected from $C_1$ to $C_6$ linear, branched, and cyclic alkylene and $R^{23}$ and $R^{24}$ are independently selected from H, methyl and ethyl;

an epoxy containing group of structural formula III:

(III)

where p is an integer of from zero to 6, $R^{23}$ and $R^{24}$ are as defined above, and each occurrence of $R^{21}$ and $R^{22}$ are independently selected from H, methyl and ethyl; $-(CH_2)_nC(O)OR^5$, $-(CH_2)_nC(O)OR^6$, $-(CH_2)_nOR^6$, $-(CH_2)_nOC(O)R^6$, $-(CH_2)_nC(O)R^6$, and $-(CH_2)_nOC(O)OR^6$;

any combination of two of $R^1$, $R^2$, $R^3$, and $R^4$ linked together by a linking group selected from $C_1$ to $C_{25}$ linear, branched, and cyclic alkylene and alkylene aryl, wherein n is an integer of from 1 to 25, $R^5$ is an acid labile group and $R^6$ is selected from H, $C_1$ to $C_6$ linear, branched, and cyclic alkyl, an epoxy containing group of structural formula II as defined above; and one type of repeat unit selected from repeat units having structural units XI, XII, XIII, XIV and XV, where such one type of repeat unit represents up to 25 mole % of the copolymer's repeat units:

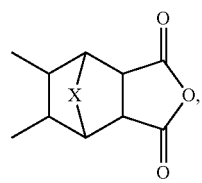
(XI)

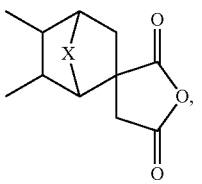
(XII)

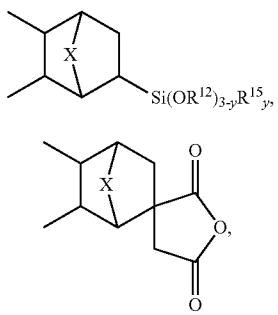
(XIII)

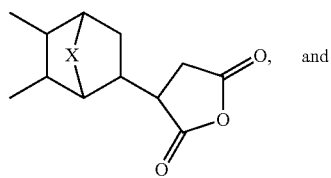
(XIV)
and

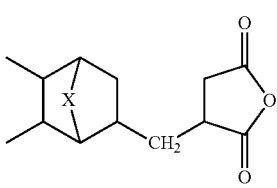
(XV)

where X is defined as above, y is 0, 1 or 2; $R^{12}$ is selected from $C_1$ to $C_6$ linear, branched, and cyclic alkyl; and $R^{15}$ is selected from H and $C_1$ to $C_4$ linear and branched alkyl; and another type of repeat unit having one of $R^1$, $R^2$, $R^3$, or $R^4$ being a pendant epoxy containing group in accordance with formulae II or III, and where the others of $R^1$, $R^2$, $R^3$, or $R^4$ are each H; and where such another type of repeat units represents from 20 mole % to 60 mole % of the copolymer's repeat units.

* * * * *

UNITED STATES PATENT AND TRADEMARK OFFICE
CERTIFICATE OF CORRECTION

PATENT NO. : 8,114,948 B2
APPLICATION NO. : 11/324738
DATED : February 14, 2012
INVENTOR(S) : Edmund Elce et al.

It is certified that error appears in the above-identified patent and that said Letters Patent is hereby corrected as shown below:

Column 1, Line 8, delete "Pat," and insert -- Patent --

Column 31, Line 41, Claim 1, delete "R3,or" and insert -- R3, or --

Column 31, Line 43, Claim 1, delete "R3,or" and insert -- R3, or --

Column 33, Lines 10-15, Claim 2, delete " 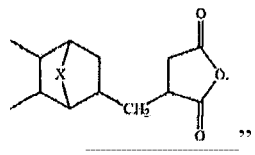 " and insert -- 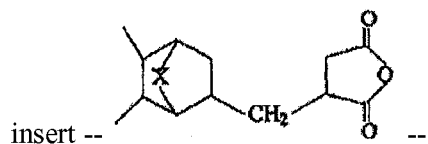 --

Column 34, Line 21, Claim 3, delete "R3,or" and insert -- R3, or --

Column 34, Line 23, Claim 3, delete "R3,or" and insert -- R3, or --

Signed and Sealed this
Third Day of July, 2012

David J. Kappos
*Director of the United States Patent and Trademark Office*